(12) United States Patent
Teranuma et al.

(10) Patent No.: US 6,242,746 B1
(45) Date of Patent: Jun. 5, 2001

(54) TWO-DIMENSIONAL IMAGE DETECTING DEVICE AND MANUFACTURING METHOD THEREOF

(75) Inventors: Osamu Teranuma, Tenri; Yoshihiro Izumi, Kashihara; Akiyoshi Fujii; Tokihiko Shinomiya, both of Nara, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/239,855

(22) Filed: Jan. 29, 1999

(30) Foreign Application Priority Data

Feb. 9, 1998 (JP) .................................................. 10-027641
Nov. 13, 1998 (JP) .................................................. 10-324003

(51) Int. Cl.$^7$ ....................................................... G01J 1/24
(52) U.S. Cl. ............................... 250/370.13; 250/370.09; 250/370.08
(58) Field of Search ........................ 250/370.08, 370.09, 250/370.11, 370.13, 370.14, 370.16, 338.4, 332

(56) References Cited

U.S. PATENT DOCUMENTS 4,940,901 * 7/1990 Henry et al. ..................... 250/370.11
6,091,194 * 7/2000 Swirbel et al. ....................... 313/498

FOREIGN PATENT DOCUMENTS 6-342098   12/1994   (JP) .

OTHER PUBLICATIONS

"A new digital detector for projection radiography," (Denny L. Lee, et al., Proc. SPIE vol. 2432, pp. 237–249, Medical Imaging 1995, May 1995).

"Application of a Si Active–Matrix technology in a X–ray detector Panel," (L.S. Jeromin, et al., SID 97 DIGEST, May 1997, pp. 91–94).

* cited by examiner

Primary Examiner—Robert Kim
Assistant Examiner—Zandra Smith
(74) Attorney, Agent, or Firm—Nixon & Vanderhye, P.C.

(57) ABSTRACT

In a two-dimensional image detecting device, an active-matrix substrate which is provided with an electrical charge storage capacity and TFT(thin-film transistor) and an opposing substrate which is provided with a semiconductive substrate are bonded to each other by using connecting members with conductivity and bonding property that are patterned in accordance with pixel electrodes of the electrical charge storage capacity. With this arrangement, it is not necessary to form a semiconductive layer onto the active-matrix substrate, the TFT having been already formed on the active-matrix substrate; thus, it is possible to form the semiconductive substrate of the opposing substrate that is made of a material selected from the group consisting of CdTe and CdZnTe, etc. Consequently, the two-dimensional image detecting device is superior in response and is capable of dealing with moving image as well.

28 Claims, 19 Drawing Sheets

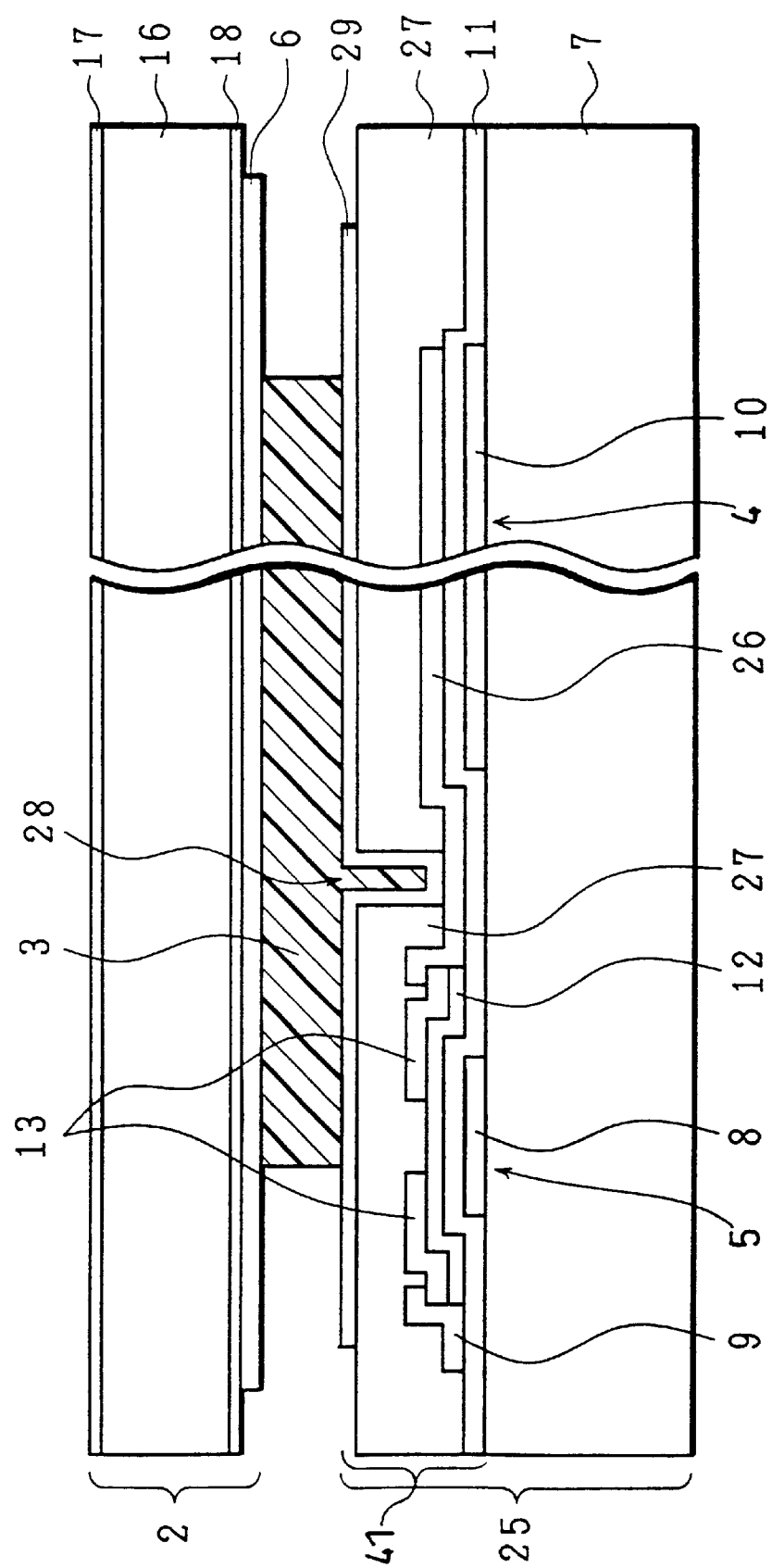

TWO-DIMENSIONAL IMAGE DETECTING DEVICE AND MANUFACTURING METHOD THEREOF

FIELD OF THE INVENTION

The present invention relates to a two-dimensional image detecting device which is capable of detecting an image for radiation such as an X-ray, a visible ray, or an infrared ray, and relates to a manufacturing method thereof.

BACKGROUND OF THE INVENTION

Conventionally, a two-dimensional image detecting device for radiation has been known in which semiconductor sensors for detecting an X-ray and a generating electrical charge(electron-positive hole) are two-dimensionally disposed, each sensor is provided with an electrical switch, and the electrical switches are successively turned on for each line and electrical charge is read for each raw.

A specific structure and principle of such a two-dimensional image detecting device are described in "D. L. Lee, et al., 'A New Digital Detector for Projection Radiography', Proc. SPIE, Vol. 2432, Physics of Medical Imaging, pp. 237–249, 1995", "L. S. Jeromin, et al., 'Application of a-Si Active-Matrix Technology in a X-ray Detector Panel', SID(Society for Information Display) International Symposium, Digest of Technical Papers, pp. 91–94, 1997", and Japanese Laid-Open Patent Publication No.342098/1994 (Tokukaihei 6-342098).

The following explanation describes the specific structure and principle of the conventional two-dimensional image detecting device for radiation. FIG. 12 is a perspective view showing a model of the construction of the two-dimensional image detecting device for radiation. Further, FIG. 13 is a sectional view showing a model of the structure for one pixel.

As shown in FIGS. 12 and 13, the two-dimensional image detecting device for radiation is provided with an active-matrix substrate having electrode wires(gate electrode 52 and source electrode 53), TFT(thin film transistor)54 and electrical charge storage capacity(Cs)55 arranged in an XY matrix form on a glass substrate 51. Moreover, a photoconductive film 56, a dielectric layer 57, and an upper electrode 58 are formed on virtually the entire surface of the active-matrix substrate.

The electrical charge storage capacity 55 has a construction in which a Cs electrode 59 opposes to a pixel electrode 60 connected with a drain electrode of the TFT 54 via an insulating film 61.

For photoconductive film 56, semiconductive materials are used so as to generate electrical charge by exposure to radiation such as an X-ray. According to the aforementioned reference books, amorphous selenium(a-Se), which has high dark resistance and favorable photoconductivity, has been used. The photoconductive film 56 is formed with a thickness of 300~600 $\mu$m by using a vacuum evaporation method.

Further, an active-matrix substrate, which is formed in a manufacturing process of a liquid crystal display device, can be applied to the aforementioned active-matrix substrate. For example, the active-matrix substrate used for an active matrix liquid crystal display device(AMLCD) is provided with the TFT made of amorphous silicon(a-Si) or polysilicon(P-Si), an XY matrix electrode, and electrical charge storage capacity. Therefore, only a few changes in arrangement make it easy to use the active-matrix substrate as that of the two-dimensional image detecting device for radiation.

The following explanation describes a principle of operations of the two-dimensional image detecting device for radiation having the above-mentioned structure.

Electrical charge is generated when the photoconductive film 56 is exposed to radiation. As shown FIGS. 12 and 13, the photoconductive film 56 and the electrical charge storage capacity 55 are electrically connected in series with each other; thus, when voltage is applied between the upper electrode 58 and the Cs electrode 59, electrical charge generated in the photoconductive film 56 moves to a positive electrode side and a negative electrode side. As a result, the electrical charge storage capacity 55 stores electrical charge. Further, an electron blocking layer 62 made of a thin insulating layer is formed between the photoconductive film 56 and the electrical charge storage capacity 55. The electron blocking layer 62 acts as a blocking photodiode for preventing electrical charge from being injected from one side.

With the above-mentioned effect, the TFT 54 comes into an open state in response to input signals of gate electrode G1, G2, G3, . . . , and Gn so that the electrical charge stored in the electrical charge storage capacity 55 can be applied to the outside from source electrodes S1, S2, S3, . . . , and Sn. The gate electrodes 52, the source electrodes 53, the TFT 54, and the electrical charge storage capacity 55, etc. are all formed in a matrix form; therefore, it is possible to two-dimensionally obtain image information of an X-ray by scanning signals for each line inputted to gate electrodes G1, G2, G3, . . . , and Gn.

Additionally, in the case when the photoconductive film 56 has photoconductivity for a visible ray and an infrared ray as well as for the radiation such as an X-ray, the above-mentioned two-dimensional image detecting device acts as a two-dimensional image detecting device for detecting the visible ray and the infrared ray.

However, the conventional arrangement has used a-Se as the photoconductive film 56. Since the a-Se has dispersive conductivity of photoelectric current, that is peculiar to amorphous materials, the a-Se is inferior in response and the sensitivity(S/N ratio) to an X-ray is not sufficient. Therefore, the electrical charge storage capacity 55 needs to be fully charged by being exposed to the X-ray for a long time in order to read information.

Further, upon irradiation of X-ray, in order to prevent electrical charge from being stored in the electrical charge storage capacity due to leakage current and in order to reduce leakage current(dark current), the dielectric layer 57 is provided between the photoconductive film 56 and the upper electrode 58. Since it is necessary to add a step (sequence) for removing electrical charge remained in the dielectric layer 57 for each frame, the above-mentioned two-dimensional image detecting device is available only when photographing a static picture.

In response to this problem, in order to obtain image data corresponding to a moving image, it is necessary to use the photoconductive film 56 which is made of crystal(or polycrystal) material and is superior in X-ray sensitivity(S/N ratio). If the sensitivity of the photoconductive film 56 improves, it becomes possible to sufficiently charge the electrical charge storage capacity 55 even when X-ray is applied for a short time. Further, the need for applying high voltage to the photoconductive film 56 is eliminated; thus, it is not necessary to arrange dielectric layer 57.

As photoconductive materials which are superior in X-ray sensitivity, CdTe and CdZnTe have been known. Generally, photoelectricity absorption for X-ray proportionally increases to the effective atomic number of absorbed substance that is multiplied to the fifth power. For example, if it is assumed that the atomic number of Se is 34 and the effective atomic number of CdTe is 50, the sensitivity is expected to improve by approximately 6.9 times. However, in the case when CdTe or CdZnTe is adopted instead of a-Se as a material of the photoconductive film 56 of the two-dimensional image detecting device for radiation, the following problem arises:

In the case of the conventional a-Se, a vacuum evaporation method can be adopted as a film-forming method and a film can be formed at a normal temperature; thus, it has been easy to form a film on the active-matrix substrate. Meanwhile, in the case of CdTe and CdZnTe, film-forming methods such as an MBE(molecular beam epitaxy)method and an MOCVD(metal organic chemical vapor deposition) method have been known. Especially when forming a film on a large substrate is taken into consideration, it is understood that the MOCVD method is suitable.

However, in the case when a material selected from CdTe and CdZnTe is made into a film by using the MOCVD method, the heat decomposition temperature of organic cadmium(dimethyl cadmium(DMCd)) is approximately 300° C., and the respective heat deposition temperatures of organic tellurium(diethyl tellurium(DETe) and diisopropyl tellurium(DiPTe)) are approximately 400° C. and 350° C.; therefore, forming a film requires a high temperature of approximately 400° C.

Generally, in the TFT 54 which is formed on the active-matrix substrate, an a-Si film and a p-Si film are used as a semiconductive layer, and these films are formed at a film-forming temperature of 300~350° C. while hydrogen ($H_2$) being added in order to improve the semiconductive property. The TFT element formed in such a process has a heat-resistance temperature of approximately 300° C.; thus, if the TFT element is processed at a temperature exceeding the heat-resistance temperature, hydrogen is released from the a-Si film and the p-Si film; consequently, the conductive property is degraded.

Therefore, it has been practically difficult to make a material selected from CdTe and CdZnTe into a film on the active-matrix substrate by using the MOCVD method from the perspective of the film-forming temperature.

SUMMARY OF THE INVENTION

The objective of the present invention is to provide a two-dimensional image detecting device which is superior in response and is capable of dealing with moving image, and to provide a manufacturing method thereof.

In order to achieve the above-mentioned objective, the two-dimensional image detecting device of the present invention, which has a pixel alignment layer including electrode wires(gate electrode and source electrode) arranged in a lattice form, a plurality of switching elements (TFT), each being disposed at each lattice point, and electrical charge storage capacities, each including a pixel electrode which is connected with the electrode wire via the switching element; an electrode section(upper electrode) formed in a manner so as to oppose virtually the entire surface of the pixel alignment layer; and a semiconductive layer(semiconductive substrate and semiconductive film) formed between the pixel alignment layer and the electrode section, the semiconductive layer having photoconductivity, is provided with an active-matrix substrate including the pixel alignment layer, and an opposing substrate including the electrode section and the semiconductive layer, both substrates being disposed in such a state in which the pixel alignment layer of the active-matrix substrate and the semiconductive layer of the opposing substrate oppose each other, and both substrates being connected with each other via connecting members(photosensitive resin and conductive bonding agent) which are patterned in accordance with the pixel electrodes and have conductivity and bonding property.

With the above-mentioned arrangement, the active-matrix substrate including a pixel alignment layer and the opposing substrate including the electrode section and the semiconductive layer are connected with each other via the connecting members which are patterned in accordance with the pixel electrodes and have conductivity and bonding property so that it becomes possible to separately form the active-matrix substrate and the opposing substrate.

Conventionally, the semiconductive layer has been formed on the substrate having the pixel alignment layer thereon so that upon forming the semiconductive layer, it has not been possible to use semiconductive materials requiring a heating operation which causes an adverse effect on the switching element of the pixel alignment layer. However, the above-mentioned arrangement makes it possible to separately form the active-matrix substrate and the opposing substrate so that it is possible to adopt materials which have not conventionally been available for the semiconductive layer.

Further, the active-matrix substrate and the opposing substrate are connected with each other via the connecting members which are patterned in accordance with the pixel electrodes so that electrical insulation can be secured for each pixel of the active-matrix substrate, and it is possible to electrically and physically connect the pixel electrodes formed on the active-matrix substrate and the semiconductive layer formed on the opposing substrate without causing cross talk between adjacent pixels.

Furthermore, in order to achieve the above-mentioned objective, a manufacturing method of a two-dimensional image detecting device of the present invention, said two-dimensional image detecting device including: a pixel alignment layer having electrode wires(gate electrode and source electrode) arranged in a lattice form, a plurality of switching elements(TFT), each being disposed at each lattice point, and electrical charge storage capacities, each having a pixel electrode which is connected with the electrode wire via the switching element; an electrode section(upper electrode) formed in a manner so as to oppose virtually the entire surface of the pixel alignment layer; and a semiconductive layer(semiconductive substrate and semiconductive film) formed between the pixel alignment layer and the electrode section with photoconductivity, said method having the steps of: (1) forming the active-matrix substrate including the pixel alignment layer; (2)forming the opposing substrate including the electrode section and the semiconductive layer; (3)forming connecting members(photosensitive resin and conductive bonding agent) which are patterned in accordance with the pixel electrodes on at least one of the active-matrix substrate and the opposing substrate and have conductivity and bonding property; and (4)connecting both substrates via the patterned connecting members in a state in which the pixel alignment layer of the active-matrix substrate and the semiconductive layer of the opposing substrate oppose each other.

With the above-mentioned arrangement, firstly, in the steps(1) and (2), the active-matrix substrate including the pixel alignment layer and the opposing substrate including the electrode section and the semiconductive layer are separately formed, and then, in step(3), on at least one of the active-matrix substrate and the opposing substrate, the connecting members are formed so as to be patterned in accordance with the pixel electrodes, and in step(4), both substrates are connected with each other via the connecting members.

Therefore, with the above-mentioned manufacturing method, unlike the conventional method, it is not necessary to form another semiconductive layer on the substrate which already has had the pixel alignment layer formed thereon. Conventionally, it has not been possible to adopt the semiconductive materials which cause an adverse effect on the switching elements of the pixel alignment layer upon forming the semiconductive layer; however, the above-mentioned method allows the active-matrix substrate and the opposing substrate to be separately formed so that materials which has not been available in prior art, for example, compound semiconductor, which is made of a material selected from CdTe and CdZnTe, can be used for the semiconductive layer.

These semiconductive materials have higher sensitivity (S/N ratio) to radiations such as an X-ray as compared with a-Se which has been conventionally used; therefore, by using the compound semiconductor made of a material selected from CdTe and CdZnTe for the semiconductor layer, the response of the two-dimensional image detecting device can be improved and furthermore, it becomes possible to detect moving image. For a fuller understanding of the nature and advantages of the invention, reference should be made to the ensuing detailed description taken in conjunction with the accompanying drawings.

BRIEF DESCRIPTION OF THE DRAWINGS

FIG. 4(*b*) is an explanatory drawing showing an example of the process for bonding the active-matrix substrate and the opposing substrate of the two-dimensional image detecting device.

FIG. 4(*c*) is an explanatory drawing showing an example of the process for bonding the active-matrix substrate and the opposing substrate of the two-dimensional image detecting device.

FIG. 4(*d*) is an explanatory drawing showing an example of the process for bonding the active-matrix substrate and the opposing substrate of the two-dimensional image detecting device.

FIG. 5(*b*) is an explanatory drawing showing the manufacturing method of the two-dimensional image detecting device in accordance with the second embodiment of the present invention and an example of the process for patterning the photosensitive resin on the active-matrix substrate.

FIG. 5(*c*) is an explanatory drawing showing the manufacturing method of the two-dimensional image detecting device in accordance with the second embodiment of the present invention and an example of the process for patterning the photosensitive resin on the active-matrix substrate.

FIG. 9(*b*) is an explanatory drawing showing the manufacturing method of the two-dimensional image detecting device in accordance with the fourth embodiment of the present invention and an example of the process for bonding the active-matrix substrate and the opposing substrate of the two-dimensional image detecting device.

FIG. 9(*c*) is an explanatory drawing showing the manufacturing method of the two-dimensional image detecting device in accordance with the fourth embodiment of the present invention and an example of the process for bonding the active-matrix substrate and the opposing substrate of the two-dimensional image detecting device.

FIG. 9(*d*) is an explanatory drawing showing the manufacturing method of the two-dimensional image detecting device in accordance with the fourth embodiment of the present invention and an example of the process for bonding the active-matrix substrate and the opposing substrate of the two-dimensional image detecting device.

FIG. 9(*e*) is an explanatory drawing showing the manufacturing method of the two-dimensional image detecting device in accordance with the fourth embodiment of the present invention and an example of the process for bonding the active-matrix substrate and the opposing substrate of the two-dimensional image detecting device.

FIG. 10 is a sectional view showing the two-dimensional image detecting device in accordance with the fifth embodiment of the present invention and the construction for one pixel of the two-dimensional image detecting device.

DESCRIPTION OF THE EMBODIMENTS
[EMBODIMENT 1]

Figure 1:
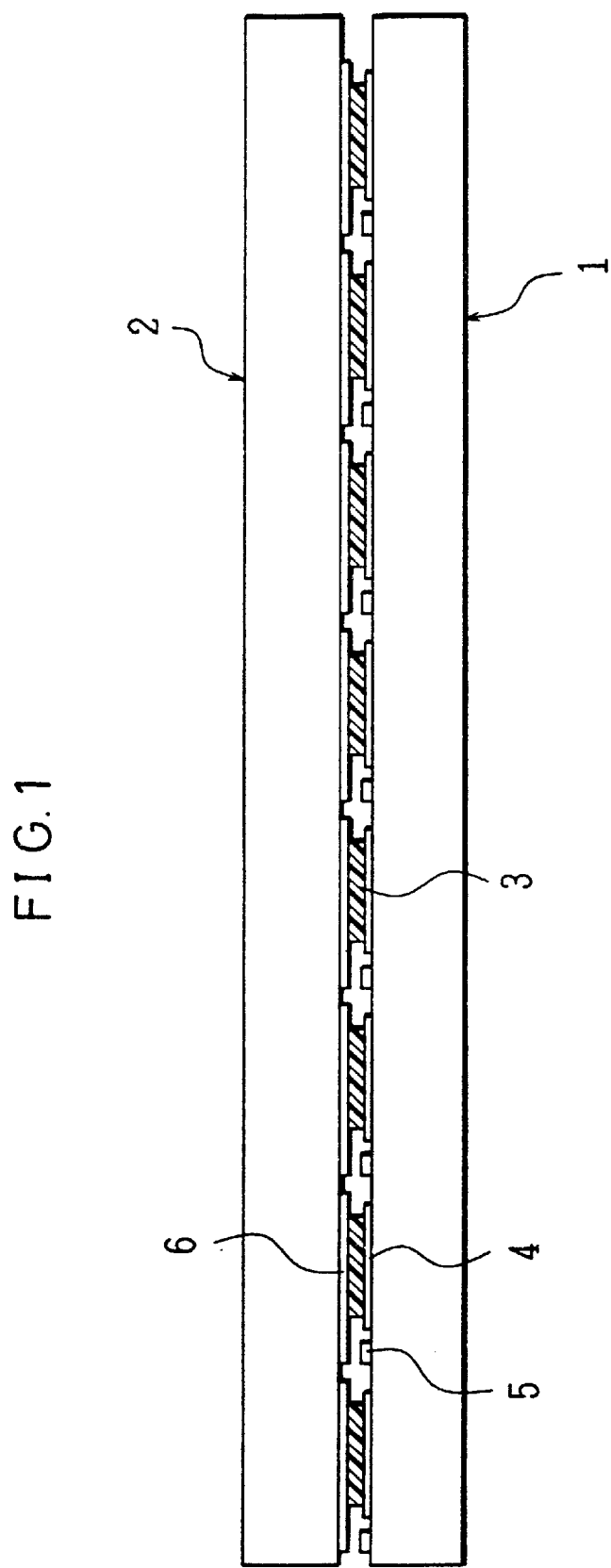
FIG. 1 is a sectional view which shows a two-dimensional image detecting device in accordance with the first embodiment of the present invention and schematically shows an entire construction of the two-dimensional image detecting device.

As shown FIG. 1, the two-dimensional image detecting device of the present embodiment has a construction in which an active-matrix substrate 1 having electrical charge storage capacities 4 and TFTs(thin-film transistor) 5 serving as switching elements, and an opposing substrate 2 having connecting electrodes 6 are bonded to each other by photosensitive resin 3(connecting member) which has conductivity and bonding property. Here, the bonding property of the present embodiment also includes adhesive property.

Figure 2:
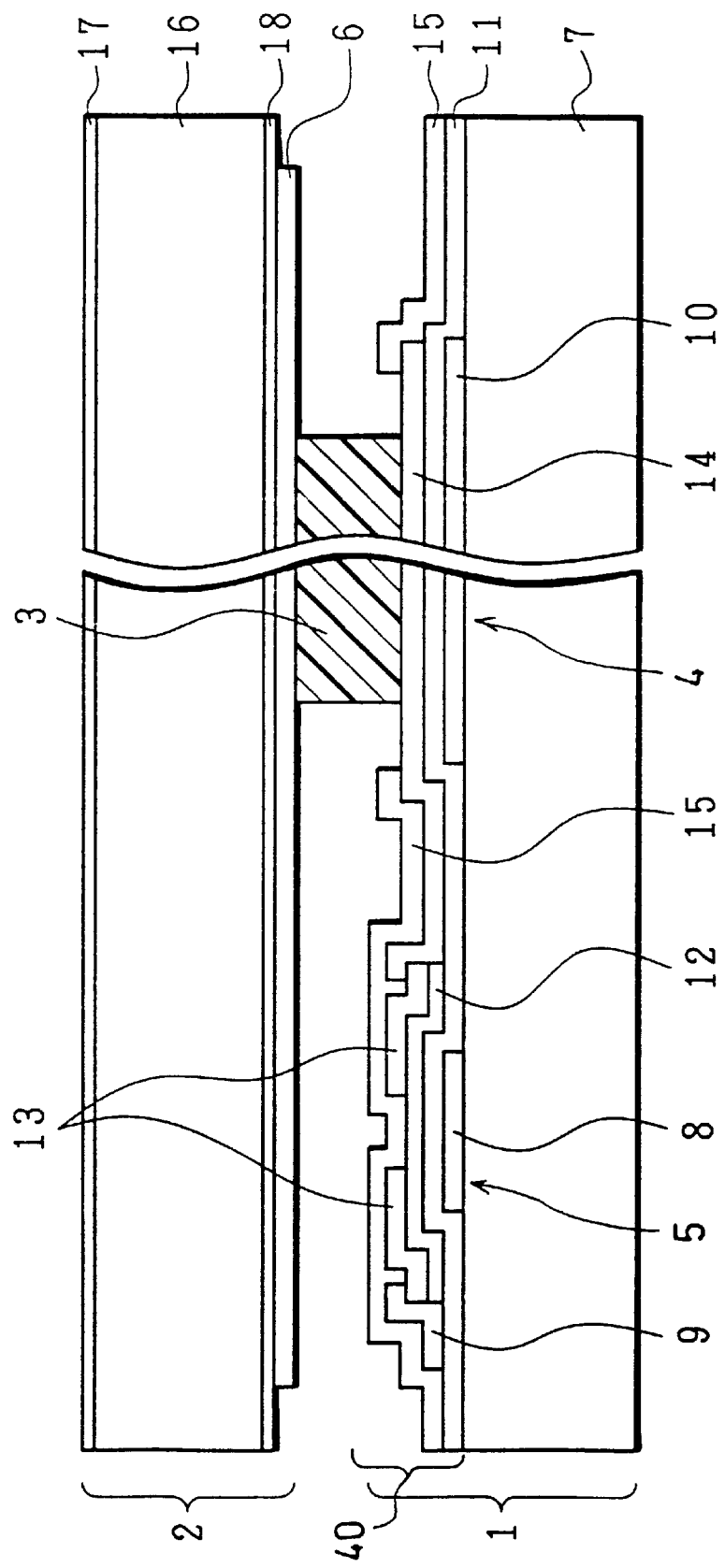
FIG. 2 is a sectional view showing the construction for one pixel of the two-dimensional image detecting device.

FIG. 2 describes a specific construction for one pixel of the two-dimensional image detecting device.

The active-matrix substrate 1 has a construction in which electrode wires formed by a gate electrode 8 and a source electrode 9, the electrical charge storage capacity 4, and the TFT 5 are formed in an XY matrix form on a glass substrate 7. Namely, a pixel alignment layer 40 of the active-matrix substrate 1 is constituted by the above-mentioned electrodes 8 and 9 (electrode wire), the electrical charge storage capacity 4, and TFT 5.

A non-alkali glass substrate(for example, #7059 and #1737 manufactured by Corning Industries, Inc.)is used for the glass substrate 7. And the gate electrode 8 made of a metal film is formed thereon. The metal film is made of a material of Ta, etc. The gate electrode 8 is obtained by patterning the metal film made of Ta, etc. into a desired shape after the Ta, etc. has been made into a film with a thickness of approximately 3000 Å by a sputtering evaporation. At this time, a Cs electrode 10 of the electrical charge storage 4 is formed as well. Next, an insulating film 11 made of SiNx and/or SiOx is formed into a film with a thickness of approximately 3500 Å by using a CVD(chemical vapor deposition)method. The insulating film 11 serves as a gate insulating film for the TFT 5 and a dielectric layer between the electrodes of the electrical charge storage capacity 4. Additionally, for the insulating film 11, an anodic oxidation film which is formed by anodizing the gate electrode 8 and the Cs electrode 10, can be adopted together with SiNx and/or SiOx.

And then, an a-Si film(i-layer)12, which serves as a channel portion of the TFT 5, and an a-Si film($n^+$-layers)13, which makes a contact with the source electrode and a drain electrode, are respectively formed into films with thicknesses of approximately 1000 Å and 400 Å by using the CVD method, and these films are patterned into desired shapes. Next, the source electrode 9 and a drain electrode (used for a pixel electrode 14 as well) are made of a metal film made of Ta and/or Al, etc. The source electrode 9 and the drain electrode are obtained by patterning the metal film into a desired shape after these films have been made into films with a thickness of approximately 3000 Å by the sputtering evaporation. Further, it is possible to separately form the pixel electrode 14 and the drain electrode, and to use a transparent electrode of ITO, etc. as the pixel electrode 14.

Afterwards, in order to insulate and protect an area except for an aperture portion of the pixel electrode 14, an insulating/protecting film 15 is formed. After the film has been made into a film with a thickness of approximately 3000 Å by using the CVD method, the insulating/protecting film 15 is obtained by patterning the insulating film made of SiNx and SiOx into a desired shape. For the insulating/protecting film 15, it is possible to adopt an organic film made of acryl or polyimide, etc. besides an inorganic insulating film. With the above-mentioned process, the active-matrix substrate 1 is formed.

Here, as a TFT element of the active-matrix substrate 1, the TFT 5 using a-Si which has an inverse stagger structure is adopted; however, the TFT element is not particularly limited to this structure. It is possible to adopt p-Si, and to adopt a staggering structure. Further, the active-matrix substrate 1 can be formed in the same manner as the active-matrix substrate which is formed in the manufacturing process of a liquid crystal display apparatus.

Meanwhile, the opposing substrate 2 includes a semiconductive substrate(semiconductive layer)16 which has photoconductivity to radiation such as an X-ray, as a supporting substrate. Here, a compound semiconductor made of a material selected from CdTe and CdZnTe is used. The thickness of the semiconductive substrate 16 is approximately 0.5 mm. It is possible to easily form a crystal substrate for the semiconductive substrate 16 by using a Bridgman method, a gradient freeze method, a travel heating method, and so on. On virtually the entire surface of the semiconductive substrate 16, an upper electrode(electrode section)17 is formed by a metal which easily transmits an X-ray such as Al. Moreover, on the other surface, an electron blocking layer 18 made of AlOx is virtually entirely formed with a thickness of approximately 100~300 Å as an insulating layer. And then, the metal film made of Ta and Al is made into a film with a thickness of approximately 2000 Å by the sputtering evaporation, and patterned into a desired shape so as to be formed into the connecting electrode 6. The connecting electrode 6 is placed so as to oppose the pixel electrode 14 formed on the active-matrix substrate 1.

Afterwards, the photosensitive resin 3 having conductivity and bonding property is applied or transferred to the active-matrix substrate 1 and is patterned in accordance with shapes of the pixel electrodes 14 by using a photolithographic technology, between the substrates(active-matrix substrate 1 and the opposing substrate 2) which are formed in the above-mentioned process. And the opposing substrate 2 is pressed and bonded to the active-matrix substrate 1, on which the photoconductive resin 3 patterned in the above-mentioned process is disposed, in a state in which each of the pixel electrodes 14 and the connecting electrodes 6 oppose each other. Thus, the substrates are electrically and physically connected to each other so as to achieve the two-terminal image detecting device of the present embodiment.

Figure 3:
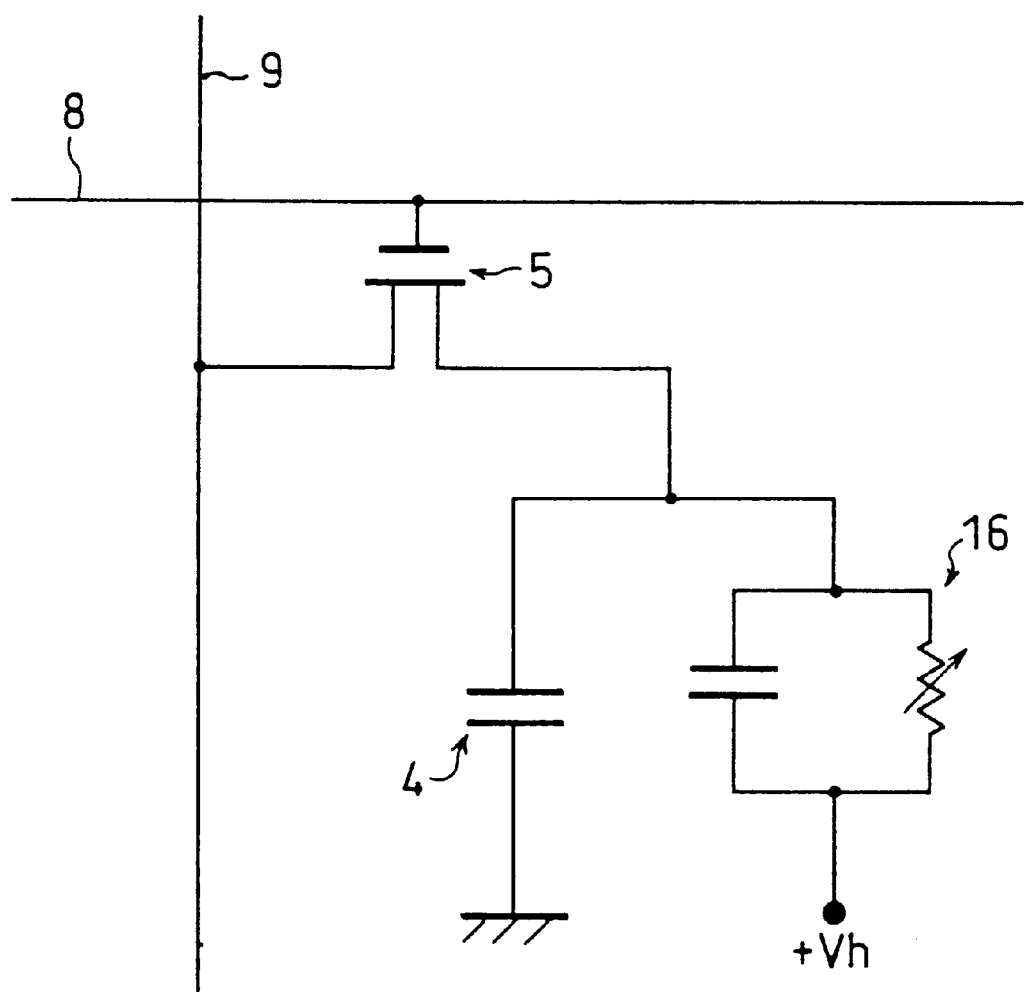
FIG. 3 is a circuit diagram showing an equivalent circuit for one pixel of the two-dimensional image detecting device.

FIG. 3 illustrates an equivalent circuit for one pixel of the two-dimensional image detecting device. Referring to FIGS. 2 and 3, the following explanation describes a principle of operation of the two-dimensional image detecting device. When an X-ray enters into the semiconductive substrate 16 made of a material selected from CdTe and CdZnTe, the photoconductive effect generates electrical charge(electron-positive hole) on the semiconductive substrate 16. At this time, the electrical charge storage capacity 4 and the semiconductive substrate 16 are connected with each other in series via the pixel electrode 14, the photoconductive resin 3, and the connecting electrode 6; thus, when voltage is applied between the upper electrode 17 and the Cs electrode 10, electrical charge appearing within the semiconductive substrate 16 respectively moves to the positive electrode side and the negative electrode side. Consequently, electric charge is stored in the electrical charge storage capacity 4.

Moreover, between the semiconductive substrate 16 and the connecting electrode 6, the electron blocking layer 18 made of a thin insulating layer is formed so as to serve as a blocking photodiode with MIS(Metal-Insulator-Semiconductor) structure for blocking the entry of electrical charge from one side. This arrangement reduces dark current when an X-ray does not enter. In other words, in the case when positive voltage is applied to the upper electrode 17, the electron blocking layer 18 blocks the electrons from entering from the connecting electrode 6 into the semiconductive substrate 16. Furthermore, another insulating layer is allowed to be arranged between the semiconductive substrate 16 and the upper electrode 17 so as to block the positive holes from entering from the upper electrode 17 into the semiconductive substrate 16; consequently, it is possible to reduce more dark current.

As for the structure of the blocking photodiode, besides the MIS structure, it is certainly possible to adopt a heterojunction structure using a stacked film made of a material selected from CdTe and CdS, etc., PIN junction structure, and a Shottky junction structure.

Figure 12:
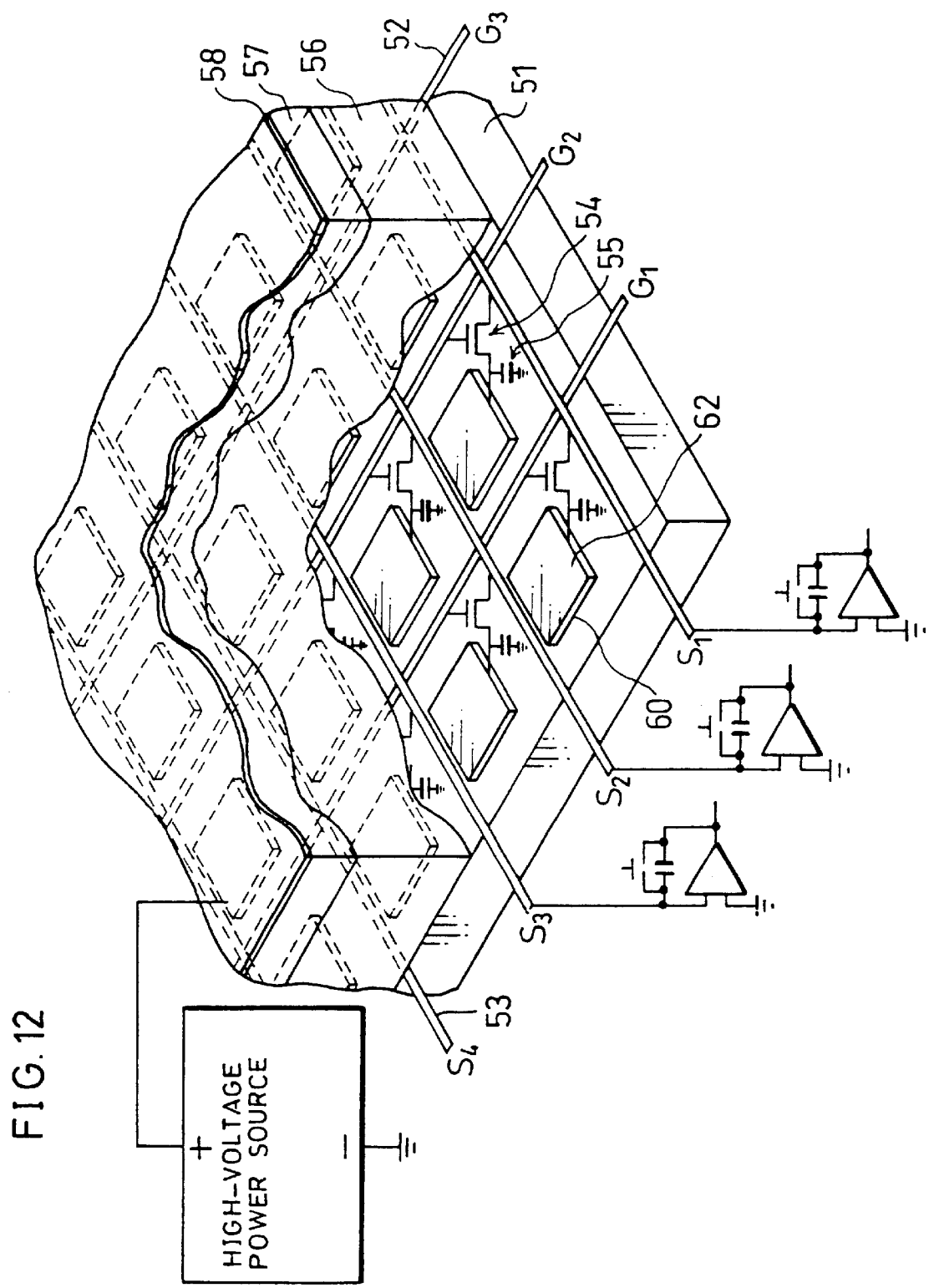
FIG. 12 is a perspective view showing a construction of a conventional two-dimensional image detecting device.
Figure 13:
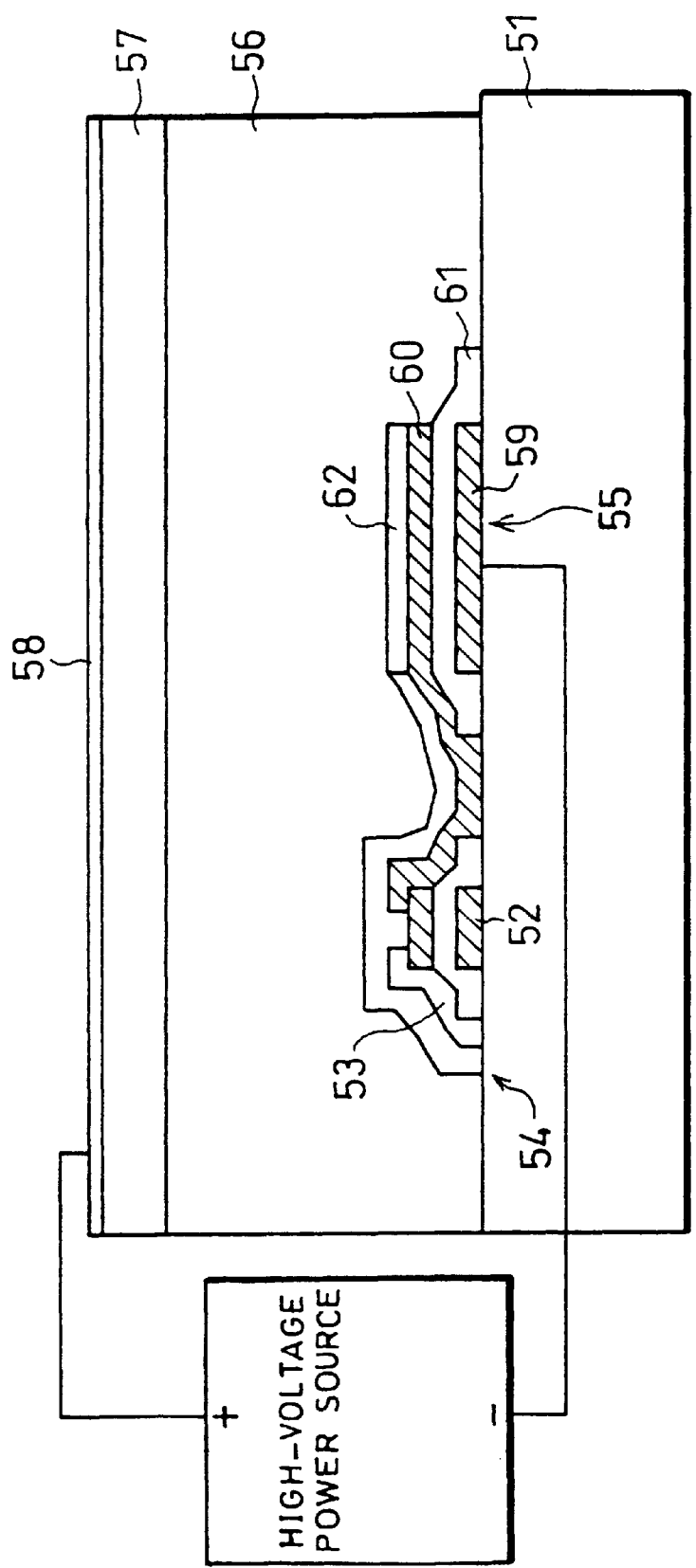
FIG. 13 is a sectional view showing the construction for one pixel of the conventional two-dimensional image detecting device.

With the above-mentioned function, it is possible to take electrical charge stored in the electrical charge storage capacity 4 from the source electrode 9 to the outside by allowing the TFT 5 to come into an open status in response to an input signal of the gate electrode 8. Further, referring to FIG. 12 of prior art, the electrode wires(gate electrode 8 and source electrode 9), TFT 5, and the electrical charge storage capacity 4, etc. are formed in XY matrix form; therefore, signals inputted to the gate electrodes G1, G2, G3, . . . , and Gn are scanned sequentially for each line so as to obtain two-dimensional image information of the X-ray. As described above, the basic principle of operation is the same as that of the conventional two-dimensional image detecting device for radiation of prior art.

As described above, the two-dimensional image detecting device of the present embodiment has a construction in which (a)the active-matrix substrate 1 having the electrode wires formed in a lattice form, a plurality of TFTs 5, each being disposed on each lattice point, and a plurality of pixel electrodes 14 and (b) the opposing substrate 2 having the semiconductive substrate 16 with photoconductivity formed on virtually the entire surface, are electrically and physically connected with each other by the photosensitive resin 3 which has conductivity and bonding property.

Therefore, unlike the conventional two-dimensional image detecting device for radiation in which a photoconductive semiconductor is formed into a film directly on the active matrix substrate, it is possible to raise the limit of the film-forming temperature of the photoconductor that has been set due to the heat-resistance of the active-matrix substrate in the present embodiment. As a result, it becomes possible to adopt semiconductive materials(for example, CdTe or CdZnTe), that conventionally can not be formed into a film directly on the active-matrix substrate, for the two-dimensional image detecting device.

In this case, it is necessary to set a limit on a temperature in the process for bonding the photosensitive resin 3 due to the heat-resistance of the active-matrix substrate. However, the active-matrix substrate normally has a heat-resistance of approximately 250°; thus, it is merely necessary to choose a material for the photoconductive resin 3 that improves the bonding property below this temperature. Consequently, this arrangement does not cause any problems upon using a material selected from CdTe and CdZnTe as the semiconductive materials.

For this reason, since CdTe and/or CdZnTe can be used for semiconductive substrate 16, sensitivity to an X-ray can be improved as compared with the conventional two-dimensional image detecting device which adopts a-Se, and it is possible to eliminate the need for arranging the dielectric layer between the semiconductive substrate 16 and the upper electrode 17; therefore, this arrangement makes it possible to obtain image data responding to moving image, that is, image data at the rate of 33 msec/frame.

Further, the two-dimensional image detecting device has connecting electrodes 6 independently formed for each of the pixels on the bonding surface of the semiconductive substrate 16 so as to oppose a plurality of pixel electrodes 14 formed on the active-matrix substrate 1. With this arrangement, the pixels on the semiconductive substrate 16 of the opposing substrate 2 are electrically separated. Therefore, this arrangement allows electrical charge appearing in the semiconductive substrate 16 due to incidence of radiation and ray to be collected merely in the connecting electrode 6 corresponding to the incident position; consequently, electrical cross talk can be reduced without allowing electrical charge to enter into the surrounding pixels.

Furthermore, as shown in FIG. 1, the photosensitive resin 3, which connect the pixel electrodes 14 of the active matrix substrate 1 and the connecting electrodes 6 of the opposing substrate 2, have areas smaller than those of the connecting electrodes 6. This arrangement makes it possible to reduce electrical cross talk between adjacent pixels even if the active-matrix substrate 1 and the opposing substrate 2 are shifted to each other upon bonding the substrates. In the present embodiment, the photosensitive resin 3 is virtually a square with the side of approximately 80 μm and the connecting electrode 6 is virtually a square with the side of approximately 120 μm so that a ±20 μm margin can be secured for the shifts between the active-matrix substrate 1 and the opposing substrate 2 upon bonding the substrates.

Here, the present embodiment describes an example in which the photosensitive resin 3 is firstly applied or transferred to the active-matrix substrate 1 and then are bonded to the opposing substrate 2; however, the photosensitive resin 3 is also allowed to be firstly applied or transferred to the opposing substrate 2 and then to be bonded to the active-matrix substrate 1. In this case, it is desirable to arrange the connecting area of the photosensitive resin 3 so as to be smaller than the pixel electrodes 14.

Next, the following explanation describes the detail of the photosensitive resin 3 which is used in the present embodiment. In order to allow the photosensitive resin 3 to have conductivity, conductive particles and powders are generally dispersed in a resin. In this case, available conductive particles include metal particles such as Au and Ag, metal particles plated with Ni, transparent conductive particles such as ITO, carbon powder, and metal powder. Further, besides a method in which conductive particles are dispersed in a resin, a method which allows an organic conductive material to have photosensitivity. The present embodiment adopts the photosensitive resin 3 in which carbon powder is dispersed in the resin.

The photosensitive resin 3 is patterned into a predetermined shape on the electrodes so as to realize an electrical and physical connection which is limited between the pixel electrode 14 and the connecting electrode 6. With this arrangement, electrical insulation can be secured for each pixel so as to positively reduce cross talk between adjacent pixels.

Further, two types of the photosensitive resin 3, liquid and film types, are available. The liquid-type photosensitive resin 3 can be applied to a large substrate in a relatively simple manner by using a spinning method, etc. Meanwhile, the film-type photosensitive resin 3 can be transferred to a large substrate in a relatively simple manner by using a laminating method, etc. and is superior in keeping the thickness of the film even; therefore, even when large substrates are bonded to each other, it is possible to easily realize an even thickness of the resin.

The following explanation describes a specific method for bonding the active-matrix substrate 1 and the opposing substrate 2 by using the photosensitive resin 3.

Figure 4:
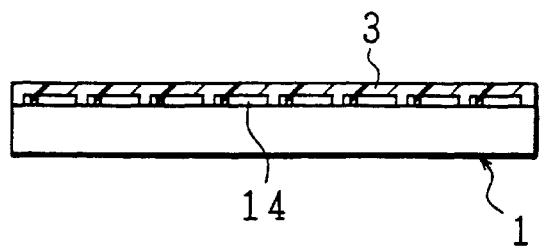
FIG. 4(*a*) is an explanatory drawing showing an example of a process for bonding an active-matrix substrate and an opposing substrate of the two-dimensional image detecting device.
Figure 4:
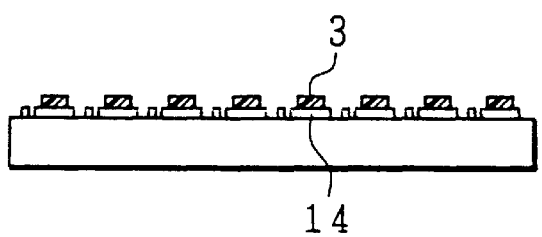
Figure 4:
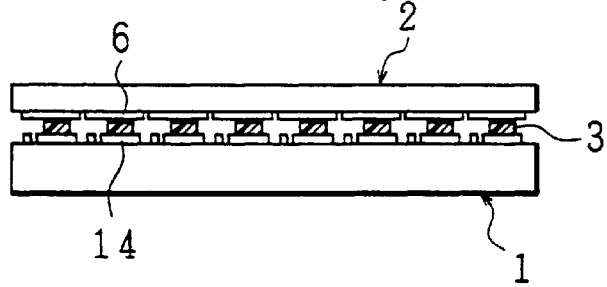
Figure 4:
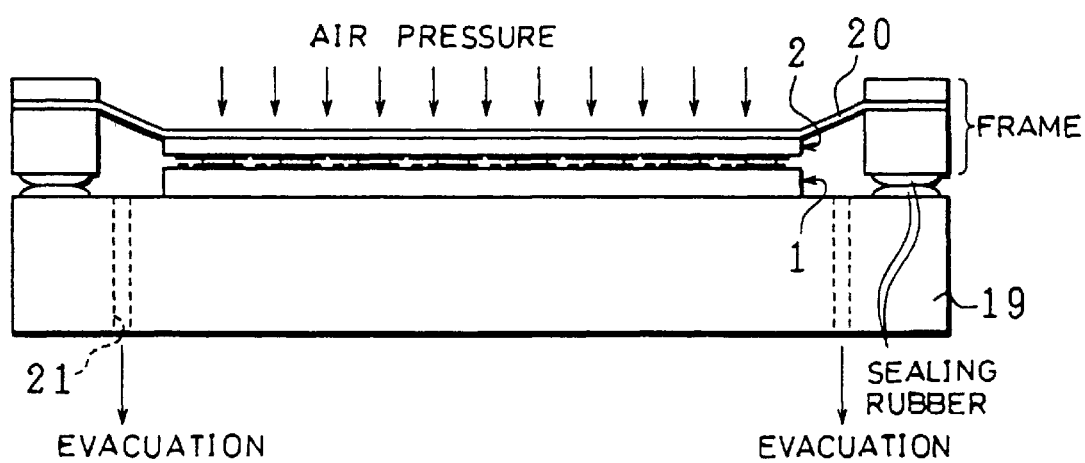

FIGS. 4(*a*) through 4(*d*) are explanatory drawings showing a process of bonding the two substrates. Firstly, as shown in FIG. 4(*a*), the photosensitive resin 3 is applied to virtually the entire bonding surface of the active-matrix substrate 1. In the case when the photosensitive resin 3 is a liquid-type resin, for example, it is possible to adopt the spinning method(formed with a film thickness of approximately 10 μm at 800 rpm×25 sec), a spraying method, a printing method, and so on. Moreover, in the case of a film-type photosensitive resin 3, for example, the laminating method, etc. can be adopted upon transferring.

Successively, as shown in FIG. 4(*b*), the photosensitive resin 3 is subjected to UV(Ultra-Violet) ray radiation with a photomask, is exposed(approximately 10 mW/cm$^2$×20 sec) in accordance with a pattern of the pixel electrodes 14, and is developed with a solution of organic alkali, etc. (development time period is approximately 60 sec).

Next, as shown in FIG. 4(*c*), both substrates are placed so as to oppose each other with a slight interval, and then the positions of the substrates are adjusted(alignment).

Afterwards, as shown in FIG. 4(*d*), both substrates are subjected to a heating press operation by using an evacuated (vacuum) pressing device. The evacuated pressing method is a method for reducing pressure between the substrates that are to be pressed, by using air pressure from the outside. This method makes it possible to uniformly press even when large substrates are bonded to each other.

The following explanation specifically describes the evacuated pressing method. Firstly, the substrates that are to be pressed are placed on a foundation(stage)19 serving as a fixed board, and are covered with a film sheet 20. Next, evacuation is carried out through evacuation outlets 21 which are formed on the foundation 19 so that the pressure is reduced between the foundation 19 and the film sheet 20. In the present embodiment, a gap, which is virtually equivalent to the thickness of the photosensitive resin 3, is formed between the substrates, and the pressure of the gap is also reduced. Consequently, both substrates are pressed by air pressure via the film sheet 20. After the evacuated(vacuum) pressing device has been baked at not less than 160° C. by using the oven, etc. in a state in which both substrates are pressed by the device, the bonding of the substrates is completed by the bonding property of the photosensitive resin 3. Additionally, the foundation 19 is also allowed to have a built-in heater for the heating operation.

As described above, the evacuated pressing device makes it possible to perform the pressing operation by using air pressure and to uniformly press the substrates even when large substrates are bonded to each other. Incidentally, in an ordinary pressure pressing method which uses a rigid body, in the case when the substrate to be pressed and/or the rigid body for applying pressure is not flat, the pressure for the pressing operation may become uneven on the surface. Moreover, the uneven pressure tends to remarkably appear as the substrate size is larger.

Note that, since the evacuated(vacuum) pressing method is a pressing method which uses air pressure, it is impossible to obtain a pressure exceeding air pressure(1 kgf/cm$^2$). Therefore, when the used photosensitive resin 3 requires pressure exceeding air pressure, it is necessary to adopt a pressure pressing device using a hydraulic pressing device or an autoclave device. In the case of the pressure pressing device and the autoclave device, a pressure of more than 1 kgf/cm$^2$ can be easily obtained. Especially in the autoclave device which presses by using a high-pressure gas(fluid), it is possible to obtain a large pressing force and at the same time, to obtain even pressure upon bonding large substrates.

Further, a method for bonding the substrates by using heating rollers is also available. In this case, from one end, the substrates arranged so as to oppose each other are sent through the rubber heating rollers which are heated at the hardening temperature of the photosensitive resin 3; thus, the substrates are bonded to each other by heating. In this case, if there is a possibility that the rapid heating may cause cracks on the substrate, the substrates can be preheated before having been heated by the rollers, or heating can be performed step by step by using not less than two kinds of rollers for low and high temperatures.

As described above, when heating is performed by using the heating rollers in accordance with the above-mentioned bonding process, even in the case of the bonding for the active-matrix substrate 1 and the opposing substrate 2 which are large in size, the need for the large-scale hydraulic pressing device is eliminated so that it is possible to simplify the bonding process and the device.

For example, in the case of the used photosensitive resin 3 requiring a pressure of 10 kgf/cm$^2$, if the hydraulic press device entirely presses the pair of the substrates whose size is approximately 40 cm×50 cm, it is necessary to apply the pressing force of 20,000 kgf. In order to obtain the above-mentioned pressing force, a large-scale pressing device is needed; however, the above-mentioned method, in which the substrates having the same sizes are successively pressed by using the heating rollers, requires merely 200~500 kgf for bonding the substrates; consequently, the device can be simplified.

[EMBODIMENT 2]

Figure 5A:
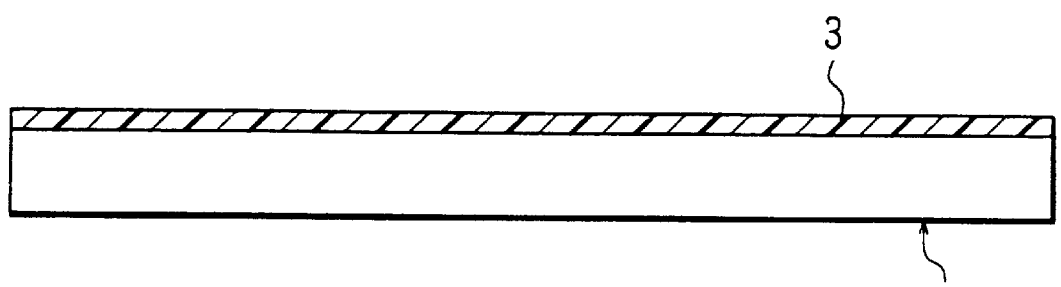
FIG. 5(*a*) is an explanatory drawing showing a manufacturing method of the two-dimensional image detecting device in accordance with the second embodiment of the present invention and an example of a process for patterning a photosensitive resin on the active-matrix substrate.
Figure 5B:
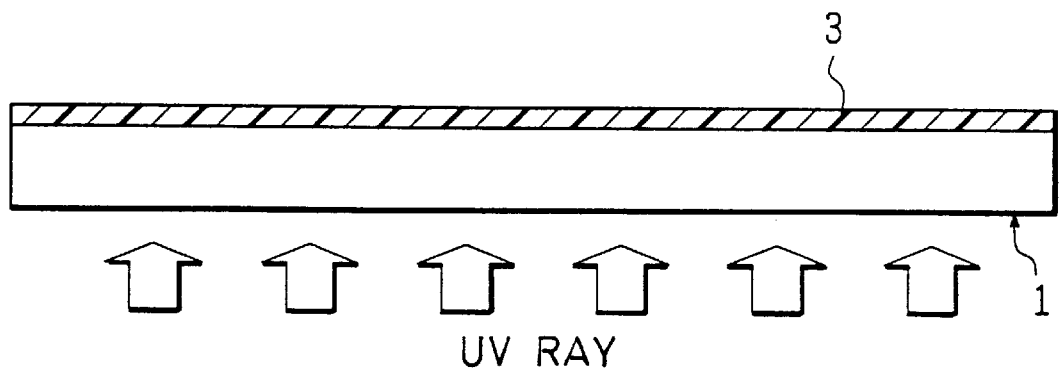
Figure 5C:
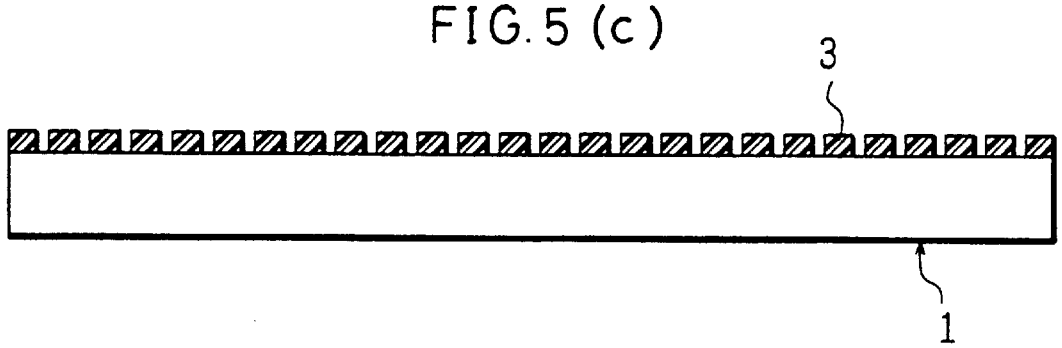

The following explanation describes another manufacturing method of the two-dimensional image detecting device which is shown in Embodiment 1. FIGS. 5(a) through 5(c) are explanatory drawings of a model showing a process in which a photosensitive resin 3 is patterned into a predetermined shape on the predetermined position of an active-matrix substrate. Note that, in the active-matrix substrate 1 of FIGS. 5(a) through 5(C), illustrations of wires, etc. are omitted.

Firstly, as shown in FIG. 5(a), the photosensitive resin 3 is applied or transferred to virtually the entire bonding surface of the active-matrix substrate 1. Here, a negative-photosensitive resin 3 which has conductivity is used as the photosensitive resin 3. Moreover, the negative-photosensitive resin is a photosensitive resin in which the portions exposed to ultraviolet radiation(UV ray), etc. are polymerized and the exposed portions are left even after having been developed, meanwhile, the portions which are not exposed are eluted upon development.

Next, as shown in FIG. 5(b), UV ray is applied from the opposite surface(back surface of the active-matrix substrate 1) of the bonding surface of the active-matrix substrate 1(exposure operation).

Figure 6:
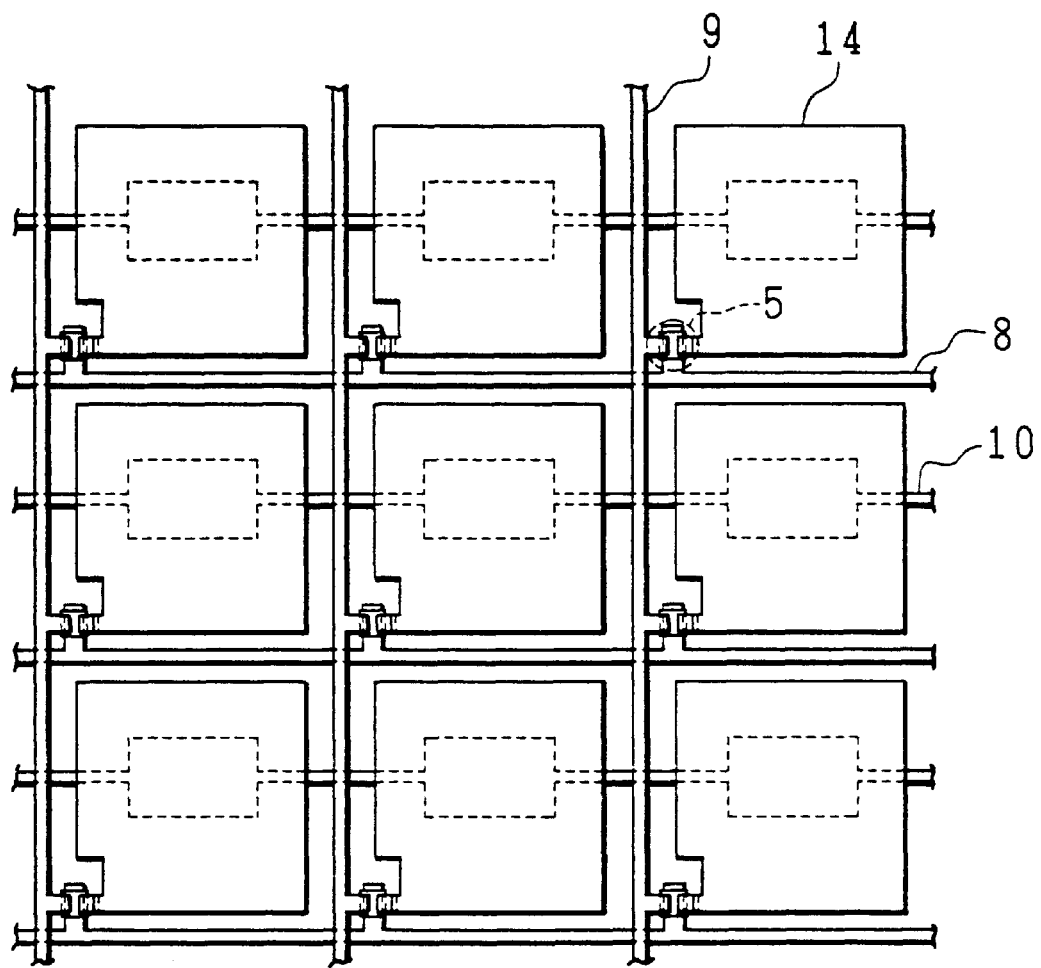
FIG. 6 is a top view showing an example of a wiring pattern of each of the electrodes formed in the active-matrix substrate.

FIG. 6 is a top view showing an example of a wiring pattern of each wire disposed on the active-matrix substrate 1. In this example, gate electrodes 8, source electrodes 9, and Cs electrodes 10 are made of metal films as described above. Meanwhile, pixel electrodes 14 are constituted by transparent electrodes including ITO. Thus, light is transmitted through all portions of the active-matrix substrate 1 except for portions on which the wires of the metal electrodes are disposed in a matrix form. Namely, the electrode wires(gate electrode 8, source electrode 9, and Cs electrode 10) formed in a matrix form on the active-matrix substrate serve as photomasks so as to realize self-alignment exposure.

Figure 7:
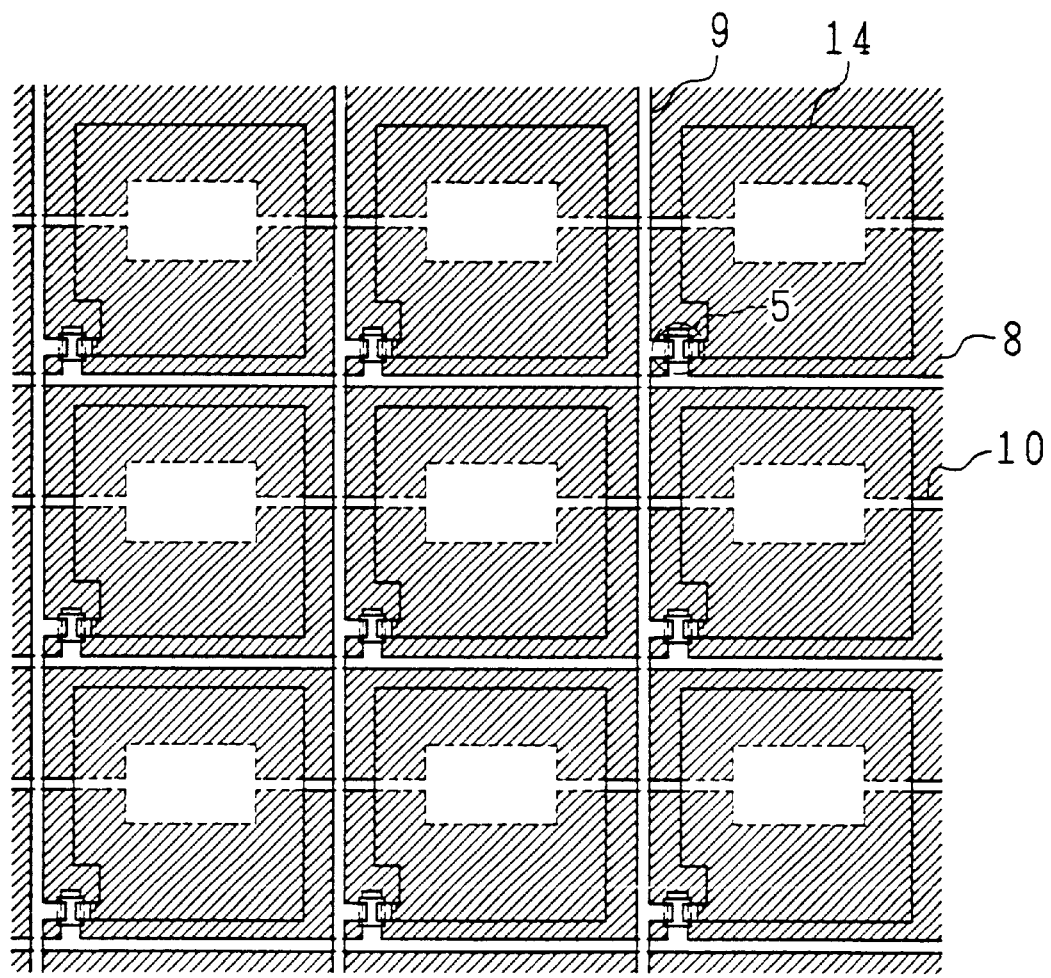
FIG. 7 is a top view showing a forming pattern of the photosensitive resin in the case of when the active-matrix substrate is subjected to self-alignment exposure.

Successively, as shown in FIG. 5(c), the exposed photosensitive resin 3 is developed so as to be patterned into a predetermined shape. For example, in the case of the active-matrix substrate 1 with the wiring pattern of wires that is shown in FIG. 6, it is possible to obtain the pattern formation of the photosensitive resin 3 that is shown in FIG. 7(portions indicated by slanting lines in FIG. 7). Namely, the photosensitive resin 3 exists merely on the portions which have no electrode wire formed in a matrix form. Therefore, as shown in FIG. 7, the patterned photosensitive resin 3 is completely independent from adjacent pixels. And the photosensitive resin 3 connects to an opposing substrate 2 so that the pixel electrodes 14 and connecting electrodes 6 are conducted to each other, and then insulation is achieved between adjacent pixels.

Since the patterning method of the photosensitive resin 3 uses the self-alignment exposure, it is not necessary to prepare a photomask, and furthermore, this method causes no shift of the pattern formation of the photosensitive resin 3. Moreover, when the area occupied by the Cs electrodes 10 per unit image is large, it is desirable to form the Cs electrodes 10 by using materials for a transparent electrode.

[EMBODIMENT 3]

Figure 8:
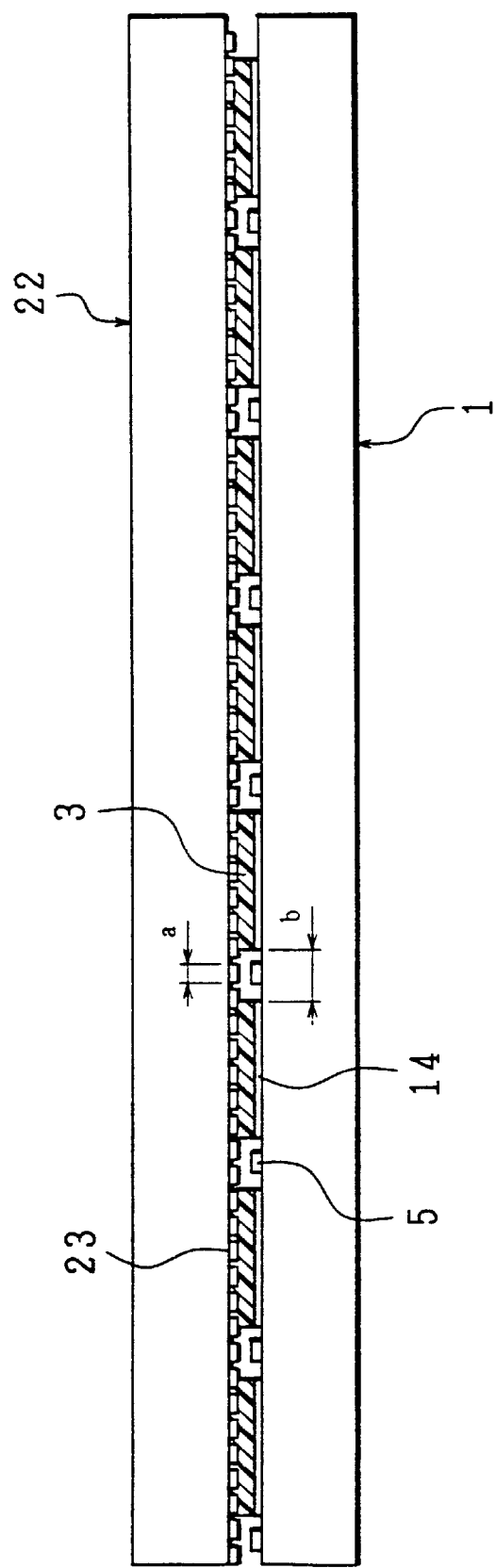
FIG. 8 is a sectional view which shows the two-dimensional image detecting device in accordance with the third embodiment of the present invention and which schematically shows the entire construction of the two-dimensional image detecting device.

The construction of an opposing substrate for the two-dimensional image detecting device of the present invention is not particularly limited to the one shown in the FIG. 1; thus, it is possible to adopt the opposing substrate which has another construction. As an example of another construction of the opposing substrate, FIG. 8 shows a construction of the two-dimensional image detecting device which adopts an opposing substrate 22. Additionally, the construction of the opposing substrate 22 is similar to the opposing substrate 2 of the FIG. 1; therefore, members having the same functions as those indicated in FIG. 1 are given the same reference numerals and explanations thereof are omitted.

On the opposing substrate 22, one pixel electrode 14 is arranged so as to oppose a plurality of connecting electrodes 23. Further, the connecting area of the photosensitive resin 3 is virtually equal to the area of the pixel electrode 14. The manufacturing method and the basic principle of operation is the same as those of Embodiment 1.

With the opposing substrate 22 having the above-mentioned construction, upon bonding the substrates, a plurality of the connecting electrodes 23 which oppose each of the pixel electrodes 14 are placed at any position in accordance with the bonding position. Therefore, even in the event of the shift upon bonding the substrates, this construction causes no problem and a sensitive positioning is not necessary.

In this case, in order to prevent leakage from occurring between adjacent pixel electrodes, it is preferable to set a width "a" of the connecting electrode 23 smaller than a distance "b" between the pixel electrodes 14. Furthermore, in order to allow the connecting electrodes 23 to efficiently absorb electrical charge appearing in a semiconductive substrate 16 and to precisely connect to the opposing pixel electrode 14, it is desirable to set an effective area of the connecting electrodes 23 so as to be as large as possible. In the present embodiment, the connecting area of the pixel electrode 14 and the photosensitive resin 3 is a square with the side of approximately 120 μm(150 μm pitch), and the connecting area of the connecting electrode 23 is a square with the side of approximately 10 μm(15 μm pitch). This arrangement makes it possible to bond the substrates without a sensitive positioning. Moreover, it is confirmed that this arrangement causes no cross talk between adjacent pixels.

[EMBODIMENT 4]

The manufacturing method of the two-dimensional image detecting device of the present invention is not particularly limited to the method shown in FIGS. 4(a) through 4(d); thus, another manufacturing method is available. FIGS. 9(a) through 9(e) show a process in which an active-matrix substrate 1 and an opposing substrate 2 are bonded to each other in accordance with another method.

Figure 9A:
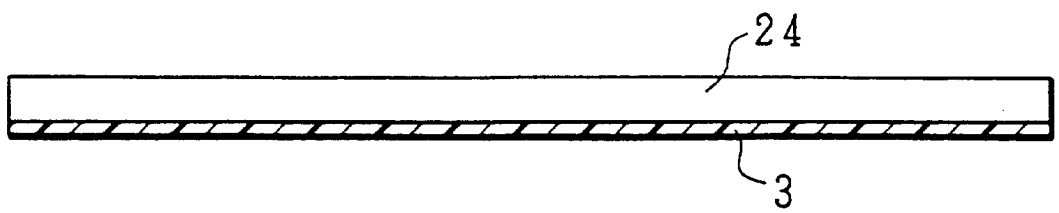
FIG. 9(*a*) is an explanatory drawing showing a manufacturing method of the two-dimensional image detecting device in accordance with the fourth embodiment of the present invention and an example of the process for bonding the active-matrix substrate and the opposing substrate of the two-dimensional image detecting device.

Firstly, as shown in FIG. 9(a), for example, on a temporary supporting body 24 which is made of polyethylene terephthalate film, etc. with a thickness of approximately 75 μm, a photosensitive resin 3 having conductivity is applied so as to have a film thickness of approximately 10 μm when being dried.

Figure 9B:
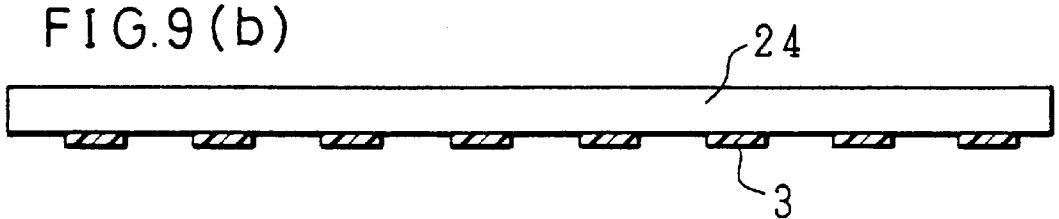

Next, as shown in FIG. 9(b), a photoconductive sheet (namely, the temporary supporting body 24 on which the photosensitive resin 3 is applied) is exposed from the side of the photosensitive resin 3 via a photomask in accordance with the pattern formation of the pixel electrodes 14, and then is developed with a solution of alkali.

Figure 9C:
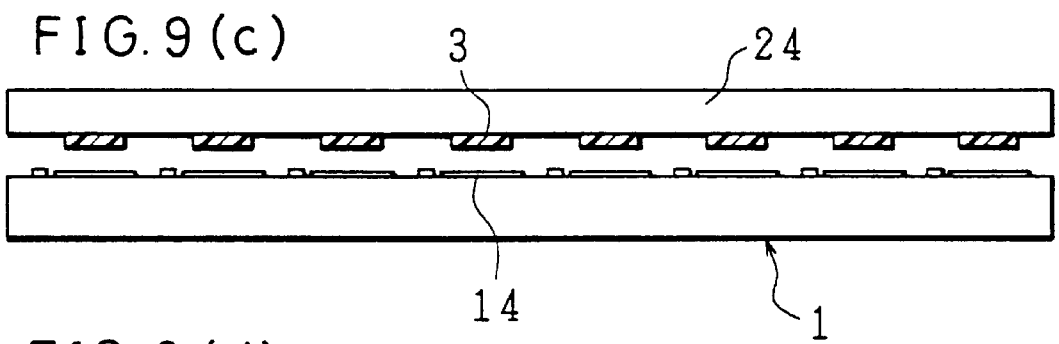

And then, as shown in FIG. 9(c), the photosensitive sheet is bonded to the active-matrix substrate 1 with a laminator in a state in which the exposure patterns oppose the pixel electrodes 14 formed on the active-matrix substrate 1(heating temperature:110° C., roller pressure: 2 kgf/cm$^2$, transporting speed: 0.2/min).

Figure 9D:
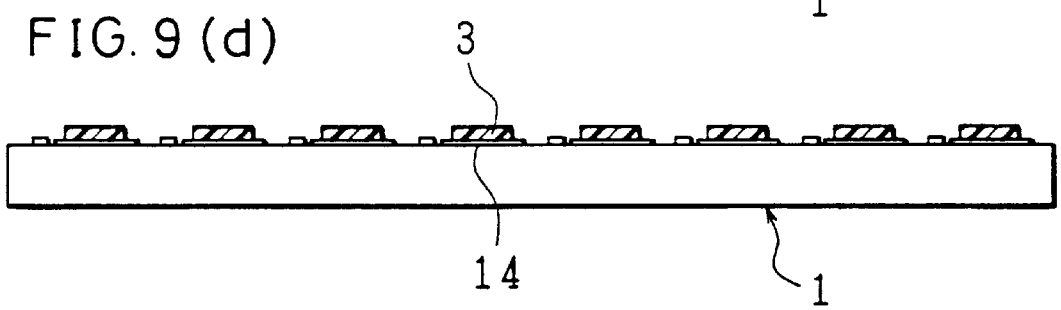

Successively, as shown in FIG. 9(d) only the temporary supporting body 24 is exfoliated so as to transfer the photosensitive resin 3 to the pixel electrodes 14.

Figure 9E:
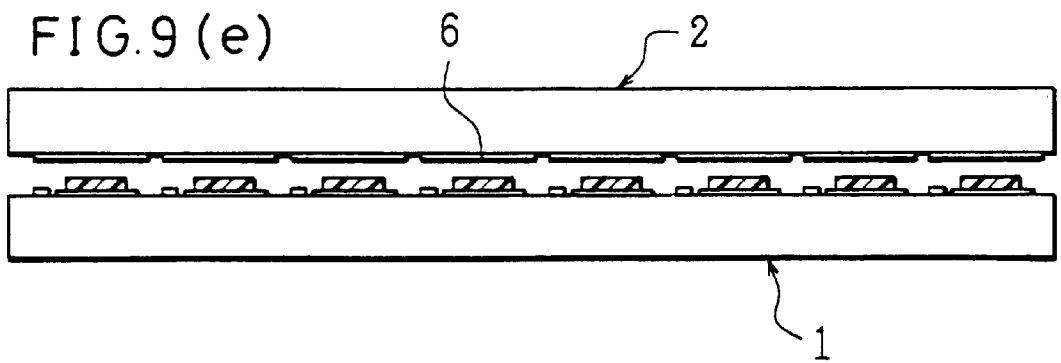

Finally, as shown in FIG. 9(e), the active matrix substrate 1 and the opposing substrate 2 are pressed and bonded to each other at approximately 160° C. The specific bonding method is not particularly limited. For example, the method described in Embodiment 1 is available.

Further, Embodiment 4 describes an example in which the opposing substrate 2 is bonded to the active-matrix substrate 1 after the photosensitive resin 3 has been transferred to the active-matrix substrate 1; however, the substrates are allowed to be bonded to each other after the photosensitive resin 3 has been transferred to the opposing substrate 2. Moreover, in order to prevent a reduction in sensitivity of the photosensitive resin 3, a solution of polyvinyl alcohol can be applied on the photosensitive resin 3 so as to form an oxygen interrupting layer. Furthermore, for the purpose of protecting the sheet and interrupting oxygen, a cover film can be provided on the polyvinyl alcohol layer.

With the above-mentioned method, the photosensitive resin 3 is patterned on the temporary supporting body 24 so that it is possible to recognize defective products before the photosensitive resin 3 has been transferred to the substrate. Further, it is possible to eliminate the influence of the photolithography operation upon the substrate. Therefore, it is possible to reduce a loss of substrates that is caused by defects and to improve the yield as compared with the method in which the photosensitive resin 3 is applied or transferred to the substrate before having been patterned.

[EMBODIMENT 5]

An active-matrix substrate used in the two-dimensional image detecting device of the present invention is not particularly limited to the construction of FIG. 2; thus, the active-matrix substrate having another construction is available. As an example of another construction of the active-matrix substrate, FIG. 10 shows the construction of the two-dimensional image detecting device in the case when an active-matrix substrate 25 is used. Additionally, the construction of the active-matrix substrate 25 is similar to that of the active-matrix substrate 1 of FIG. 2; therefore, members having the same functions as those indicated in FIG. 2 are given the same reference numerals and explanations thereof are omitted.

Like the active-matrix substrate 1 of Embodiment 1, the active-matrix substrate 25 has a construction in which an electrode wire formed by a gate electrode 8 and a source electrode 9, an electrical charge storage capacity 4, and a TFT 5 are formed into an XY matrix form on a glass substrate 7.

A non-alkali glass substrate(for example, #7059 and #1737 manufactured by Corning Industries, Inc.)is used for the glass substrate 7. And the gate electrode 8 made of a metal film made of Ta, etc. is formed thereon. After a material made of Ta, etc. has been made into a film with a thickness of approximately 3000 Å by a sputtering evaporation, the gate electrode 8 is obtained by patterning the metal film made of Ta, etc. into a desired shape. At this time, a Cs electrode 10 of the electrical charge storage 4 is formed as well. Next, an insulating film 11 made of SiNx and SiOx is formed into a film with a thickness of approximately 3500 Å by using a CVD method. The insulating film 11 serves as a gate insulating film for the TFT 5 and a dielectric layer between the electrodes of the electrical charge storage capacity 4. Additionally, for the insulating film 11, an anodic oxidation film which is formed by anodizing the gate electrode 8 and the Cs electrode 10, can be adopted in addition to SiNx and/or SiOx.

And then, an a-Si film(i-layer)12, which serves as a channel portion of the TFT 5, and an a-Si film($n^+$-layers)13, which makes a contact with the source electrode and a drain electrode, are respectively formed into films with thicknesses of approximately 1000 Å and 400 Å by using the CVD method, and these films are patterned into desired shapes. Next, the source electrode 9 and a drain electrode 26 are made of metal films of Ta and/or Al, etc. After these films have been made into films with a thickness of approximately 3000 Å by the sputtering evaporation, the source electrode 9 and the drain electrode 26 are obtained by patterning the metal films into a desired shape.

Afterwards, virtually the entire surface of the active-matrix substrate 25 is coated with an insulating protecting film 27 having a thickness of approximately 3 $\mu$m. For the insulating protecting film 27, an organic insulating film having photosensitivity, for example, acrylic resin is adopted. Next, the insulating protecting film 27 is patterned by using a photolithography technology so as to form a through hole 28 on a predetermined position. And then, on the insulating protecting film 27, a pixel electrode 29, which is made of a conductive film made of a material selected from Al, Ti, and ITO, is formed into a film with a thickness of approximately 2000 Å by using a sputtering evaporation method and is patterned into a predetermined shape. At this time, via the through hole 28 formed on the insulating protecting film 27, the pixel electrode 29 and the drain electrode 26 of the TFT 5 is electrically connected with each other.

In the same manner as Embodiment 1, via a photosensitive resin 3, the active-matrix substrate 25 having the above-mentioned construction is bonded to the opposing substrate 2 which is provided with a semiconductive substrate 16 having photoconductivity to an X-ray, as a supporting body so as to achieve the two-dimensional image detecting device. As compared with the two-dimensional image detecting device of Embodiment 1, the basic principle of operation is the same as that of Embodiment 1 except that the construction of the active-matrix substrate is somewhat different. Naturally, it is possible to bond the active-matrix substrate 25 to the opposing substrate 22 of Embodiment 3.

As described above, the two-dimensional image detecting device of the present embodiment has a construction in which virtually the entire surface of the active-matrix substrate 25 is covered with the insulating protecting film 27 made of an organic insulating film; thus, the insulating protecting film 27 is able to flatten the base substrate(electric wires and/or the TFT 5 are formed in an XY matrix form on the glass substrate 7). In other words, the construction of Embodiment 1 shown in FIG. 2 causes unevenness of approximately 1 $\mu$m on the surface of the active-matrix substrate 1 since the TFT 5 and/or the electric wires are formed in an XY matrix form; however, in Embodiment 5, as shown in FIG. 10, the insulating protecting film 27 flatten the surface of the base substrate so that the unevenness of the surface of the active-matrix substrate 25 can be reduced to approximately 0.2 $\mu$m.

Further, in the construction of Embodiment 5, the pixel electrode 29 is formed in a manner so as to overlap the TFT 5 and the electrode wires; thus, it is possible to secure a large margin upon arranging the pixel electrode 29.

[EMBODIMENT 6]

Figure 11:
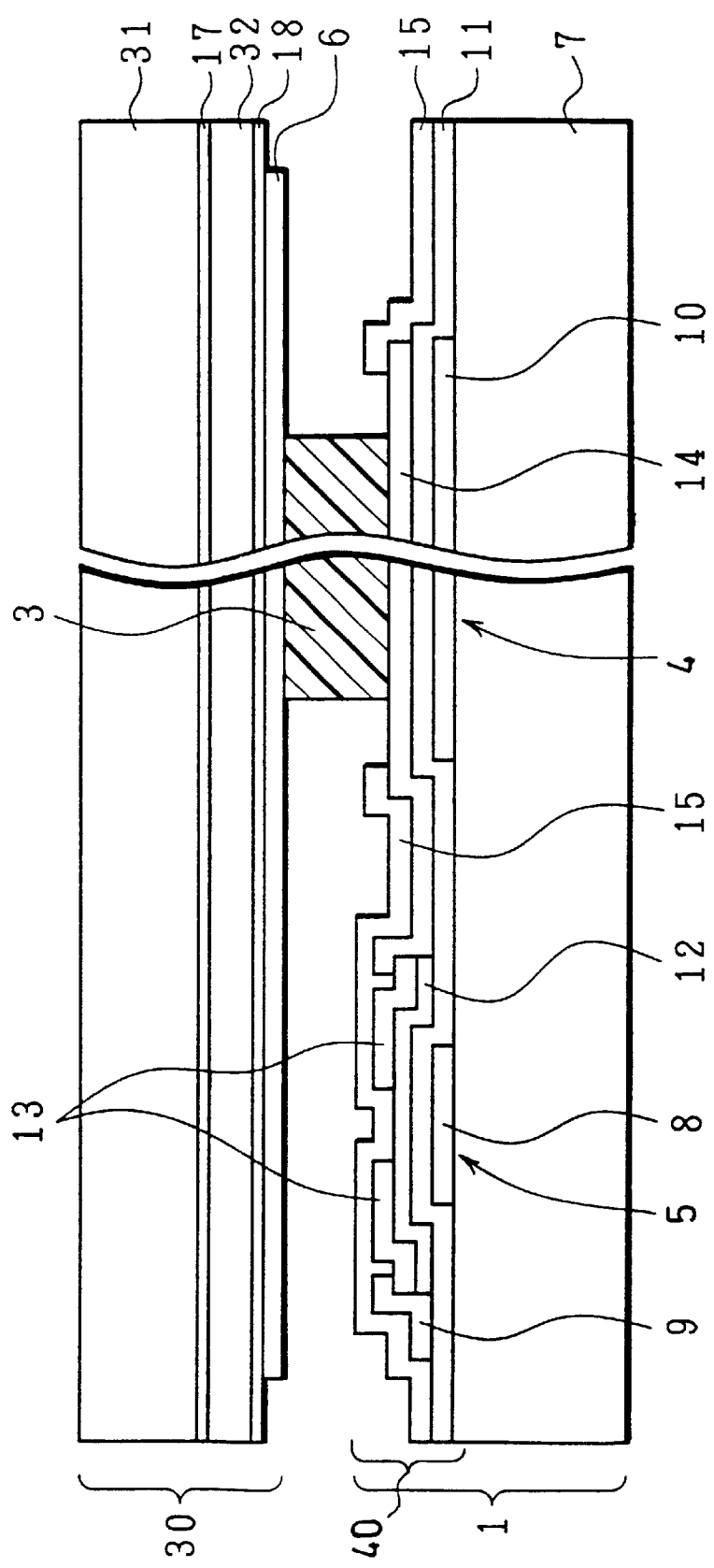
FIG. 11 is a sectional view showing the two-dimensional image detecting device in accordance with the sixth embodiment of the present invention and the construction for one pixel of the two-dimensional image detecting device.

An opposing substrate used for the two-dimensional image detecting device of the present invention is not particularly limited to the construction shown in FIG. 2; thus, the opposing substrate having another construction is available. As an example of another construction of the opposing substrate, FIG. 11 shows the construction of the two-dimensional image detecting device which uses an opposing substrate 30. Additionally, the construction of the opposing substrate 30 is similar to that of the opposing substrate 2 of FIG. 2; therefore, members having the same functions as those indicated in FIG. 2 are given the same reference numerals and explanations thereof are omitted.

As shown in FIG. 11, the opposing substrate 30 is mainly constituted by a supporting substrate 31 and a semiconductive film(semiconductive layer)32 formed on the supporting substrate 31. For the supporting substrate 31, it is necessary to use a substrate which is capable of transmitting an X-ray. Glass, ceramic, and silicon substrates, etc. are available. Here, the present embodiment adopts a glass substrate with a thickness of 0.7~1.1 mm that is superior in transmitting both X-ray and visible light.

Firstly, an upper electrode 17 is formed on virtually one entire surface of the supporting substrate 31 by using metals such as Ti and Ag. However, in the case when the two-dimensional image detecting device is used for detecting visible light image, a transparent ITO electrode for dealing with visible light is used as the upper electrode 17.

Successively, as the semiconductive film 32, a polycrystal film made of a material selected from CdTe and CdZnTe is formed on the upper electrode 17 with the thickness of approximately 0.5 mm by using an MOCVD method. With the MOCVD method which is suitable for forming a film on a large substrate, it is possible to form a film at a film-forming temperature of 400~500° C. by using materials including organic cadmium(dimethyl cadmium[DMCd], etc.), organic tellurium(dietyl tellurium[DETe], diisopropyl tellurium[DiPTe], etc.), and organic zinc(diethyl zinc [DMZn], diisopropyl zinc[DiPZn], dimethyl zinc[DMZn], etc.). Furthermore, as a method for forming a film made of a material selected from the group consisting of CdTe and CdZnTe, a screen printing and baking method, a proximity sublimation method, an electrodeposition method, and a spraying method, etc. are available in addition to the MOCVD method.

After an electron blocking layer 18 made of a thin insulating film of AlOx has been formed on virtually the entire surface, a metal film of Ta and/or Al is formed into a film with a thickness of approximately 2000 Å and is patterned into a predetermined shape so as to achieve a connecting electrode 6. It is preferable to form the connecting electrode 6 in a manner so as to oppose an pixel electrode 14 formed on an active-matrix substrate 1.

In the same manner as in Embodiment 1, the opposing substrate 30 having the above-mentioned construction is bonded to the active-matrix substrate 1 with the photosensitive resin 3 so that the two-dimensional image detecting device is achieved. As compared with the two-dimensional image detecting device of Embodiment 1, the basic principle of operation is the same as that of Embodiment 1 except that the construction of the opposing substrate is somewhat different. Naturally, it is possible to bond the opposing substrate 30 to the active-matrix substrate 25 of Embodiment 5.

With the opposing substrate 30 having the above-mentioned construction, the semiconductive film 32 having photoconductivity is formed on the supporting substrate 31; thus, it is possible to increase the mechanical strength as compared with the opposing substrate 2 of Embodiment 1. Therefore, upon bonding the opposing substrate 30 and the active-matrix substrate 1, the opposing substrate 30 causes no crack and a large process margin is secured.

Moreover, in the case when the objective of the two-dimensional image detecting device is limited to detection of X-ray image, it is possible to allow a metal substrate which is superior in transmitting an X-ray to serve as the supporting substrate 31 and the upper electrode 17.

[EMBODIMENT 7]

The two-dimensional image detecting device of Embodiments 1 through 6 describes an example in which as a connecting member for bonding an active-matrix substrate 1(or an active-matrix substrate 25) and an opposing substrate 2(or opposing substrate 22 or 30), a photosensitive resin 3 having conductivity and bonding property(including adhesive property) is used. The photosensitive resin 3 can be patterned by using a photolithography technology so as to have an advantage of patterning with high accuracy; thus, the photosensitive resin 3 is suitable as a connecting member of the substrates in the present invention. However, the connecting member is not particularly limited to the photosensitive resin 3; thus, another connecting member is available.

Generally, a patterning operation which uses the photolithography technology requires an exposing device, a developing device, and a washing device and so on. In the case of a larger substrate, the cost of these devices tends to increase. However, for example, in the case of a method in which a conductive bonding agent is used as a connecting member and is patterned on the substrate by using a screen printing method, it is possible to simplify the process of patterning despite the fact that the accuracy of patterning is somewhat low as compared with the photolithography technology.

As a conductive bonding agent which is available for the screen printing, for example, it is desirable to adopt bonding resin such as epoxy resin, acrylic resin, and denatured urethane resin, that is dispersed with conductive materials such as carbon, Ag, and Ni. Furthermore, with regard to a screen printing device, it is possible to use a large screen printing machine for manufacturing a plasma display with a partial reform.

Figure 14:
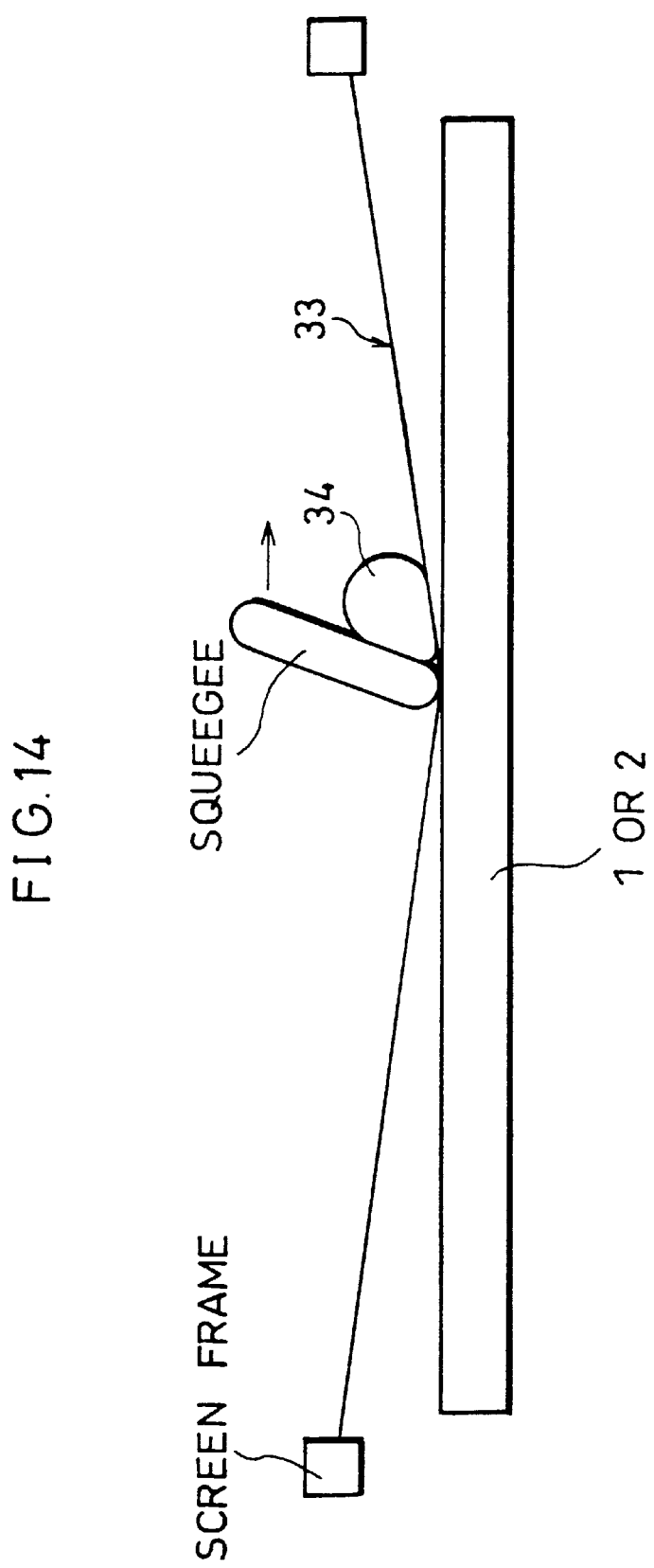
FIG. 14 is a explanatory drawing showing an outline of a screen printing device which is used in the seventh embodiment of the present invention.

FIG. 14 shows the outline of the screen printing machine. In a screen printing method, on the connecting surface of the active-matrix substrate 1 or the opposing substrate 2, by using a squeegee, paste of a conductive bonding agent 34 is pressed through a screen 33 having holes formed in accordance with the positions of the pixel electrodes so that the conductive bonding agent 34 is patterned and printed onto the connecting surface of the substrate.

Incidentally, the connecting members(conductive bonding agent 34), which are used in the two-dimensional image detecting device of the present embodiment, are formed, for example, with a pitch of approximately 150 μm on a position corresponding to the pixel electrodes formed in a matrix form; therefore, it is necessary to pattern the connecting members in a matrix form with the same pitch on a large area. However, normally, the patterning accuracy of the screen printing is considerably lower than that of the photolithography technology. This is because the screen 33 expands and contracts due to the repetition of printing. Moreover, in the case when a mesh screen using mesh fiber for the screen 33 is adopted, the mesh makes it difficult to print a small dot pattern of approximately 50 μm.

Therefore, in the present embodiment, in order to print a dot pattern of approximately 50 μm with a pixel pitch of approximately 150 μm, it is desirable to adopt a metal mask which is a thin metal sheet of Ni, stainless, etc. with holes provided in accordance with printing patterns, as the screen 33. The effect of the repeated printing on this metal mask is so small that it is possible to improve the accuracy of patterning. Furthermore, the metal mask does not have the mesh in the print holes; thus, it is possible to easily print even in the case of a dot pattern of 50 μm. Additionally, as for a shape of the dot pattern of the metal mask, it is more preferable to adopt a circular shape than a quadrilateral shape because of less unevenness of the printing pattern.

Figure 15:
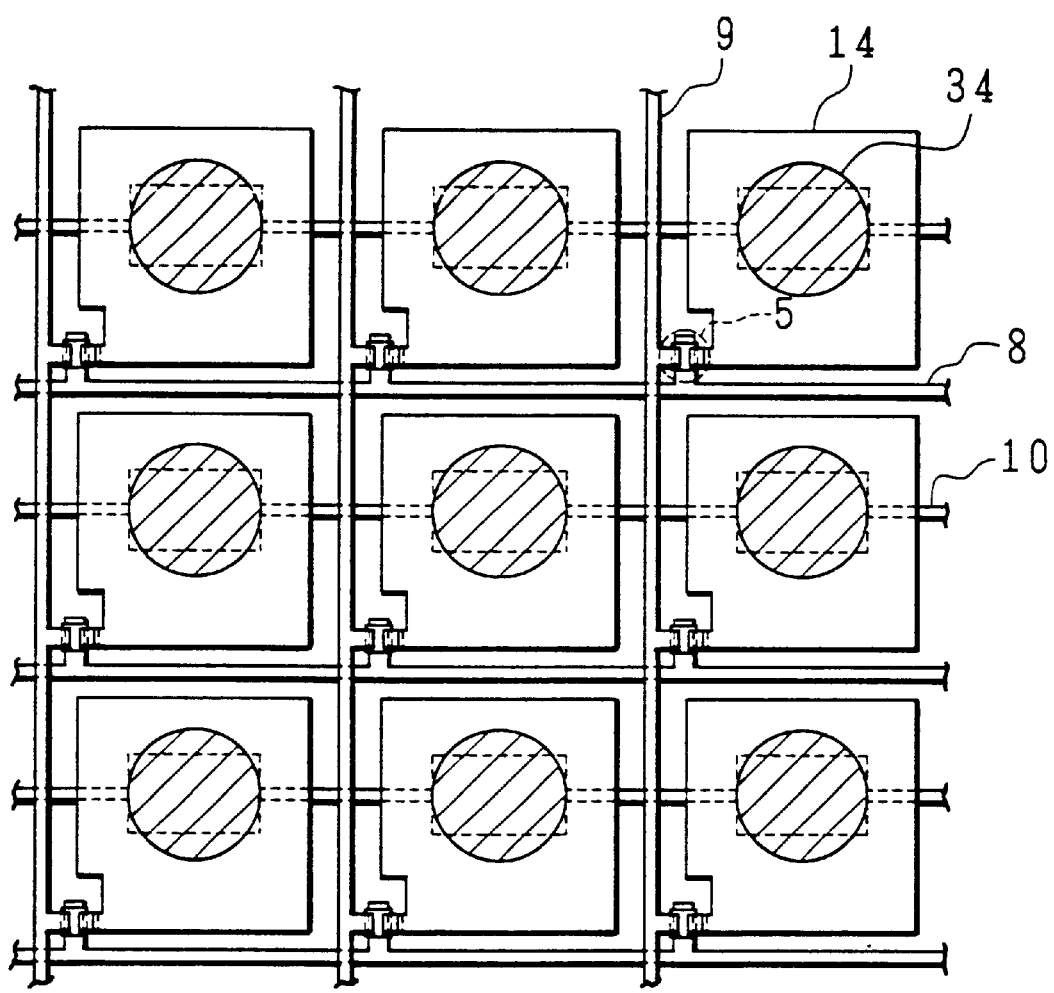
FIG. 15 is a top view showing a forming pattern of connecting members which are printed on the active-matrix substrate by using a screen printing method in accordance with the seventh embodiment of the present invention.

With the above-mentioned method, when the screen printing of the conductive bonding agent 34 is performed on virtually the entire surface of the active-matrix substrate 1 of 40 cm×50 cm with a dot pattern of 150 μm pitch and ø50 μm, it is confirmed that a shift of the printed pattern can be reduced to not more than 50 μm. FIG. 15 is a top view showing a positional relationship between the active-matrix substrate 1 and the conductive bonding agent 34(indicated by hatched portions in FIG. 15) formed by the screen printing. FIG. 15 shows that the circular conductive bonding agent 34 is printed virtually at the center of each pixel electrode 14.

The active-matrix substrate 1, on which the conductive bonding agent 34 is printed, and the opposing substrate 2 are bonded to each other so that it is possible to achieve the two-dimensional image detecting device which is the same as that described in Embodiments 1 through 6.

Further, the present embodiment describes an example of the printing method in which the conductive bonding agent 34 is printed in accordance with the screen printing technology using the metal mask. Other methods can be adopted as long as the positioning accuracy of printing is acceptable. For example, methods such as an ink jet printing method and an offset printing method are also available.

Furthermore, a patterning method of the connecting member of the present invention is not particularly limited to the aforementioned methods including: (1)the method for patterning the photosensitive resin 3 by using the photolithography technology, and (2)the method for patterning the conductive bonding agent 34 by using the printing technology. In addition, for example, non-photosensitive materials are combined with a photoresist so that methods including patterning the non-photosensitive materials by using an etching technology can be adopted.

[EMBODIMENT 8]

Embodiments 1 through 7 of the above-mentioned two-dimensional image detecting device describe a case in which an active-matrix substrate 1 and an opposing substrate 2 are bonded to each other with connecting members such as a photosensitive resin 3 having conductivity and a conductive bonding agent 34. However, as described above, upon bonding a pair of substrates with the connecting members, as the bonded substrates are larger, it becomes more difficult to keep a certain interval(gap) between the substrates.

Here, the present embodiment describes the construction of the two-dimensional image detecting device which is able to keep an interval between the substrates even in the case when the bonded substrates(for example, the active-matrix substrate 1 and the opposing substrate 2) are large.

FIGS. 16(a) through 16(d) describe an example of a manufacturing method of the two-dimensional image detecting device in accordance with the present embodiment.

Figure 16A:
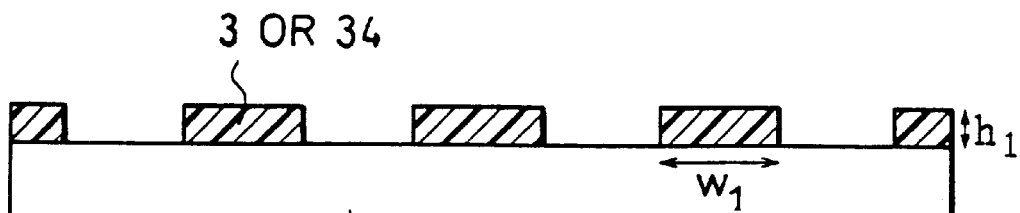
FIG. 16(a) is an explanatory drawing showing an example of the process for bonding the substrates in the case when gap keeping members are used in accordance with the eighth embodiment of the present invention.

Firstly, as shown in FIG. 16(a), on at least one of the active-matrix substrate 1 and the opposing substrate 2, connecting members such as the photosensitive resin 3 and the conductive bonding agent 34 are patterned in accordance with the pattern formation of pixel electrodes by using any one of methods described in Embodiments 1 through 7. At this time, it is assumed that the connecting member is formed so as to have a thickness of "h1" and the width of "w1".

Figure 16B:
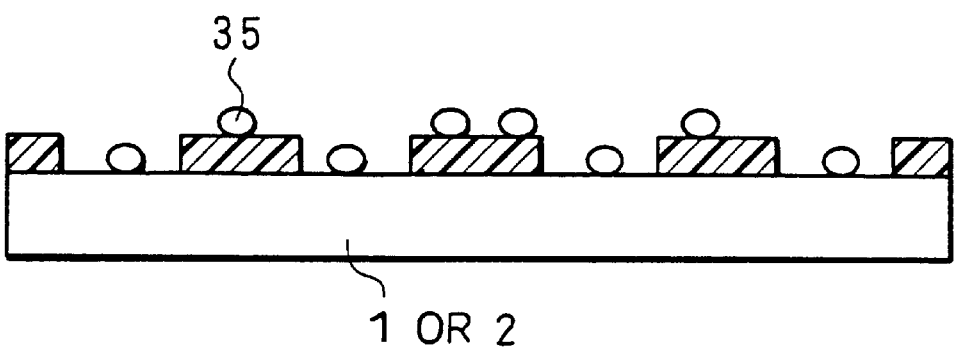
FIG. 16(b) is an explanatory drawing showing an example of the process for bonding the substrates in the case when the gap keeping members are used in accordance with the eighth embodiment of the present invention.

Next, as shown in FIG. 16(b), gap keeping members 35 are dispersed and placed onto the substrate on which the connecting members are patterned. At this time, the gap keeping members 35 are disposed at random on the patterned connecting members and portions that have no connecting member. Further, as the gap keeping member 35, it is possible to adopt a sphere and a textile(fiber) made of glass, quartz, and plastics which are superior insulators.

Figure 16C:
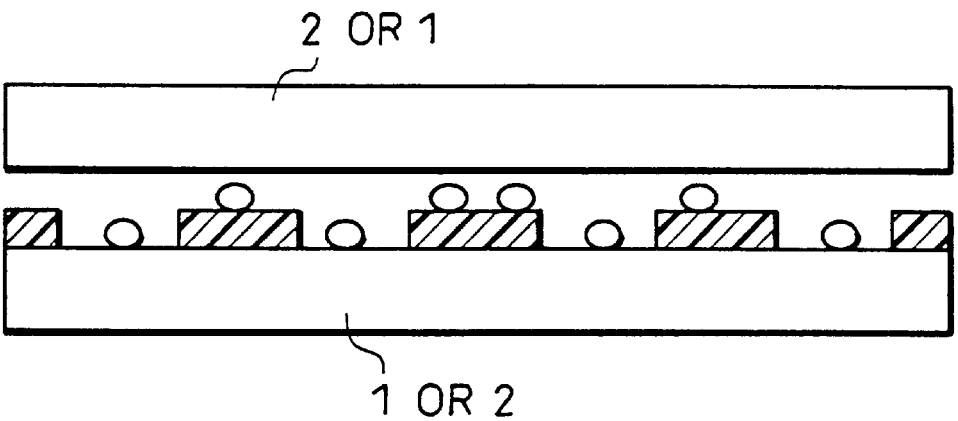
FIG. 16(c) is an explanatory drawing showing an example of the process for bonding the substrates in the case when the gap keeping members are used in accordance with the eighth embodiment of the present invention.
Figure 16D:
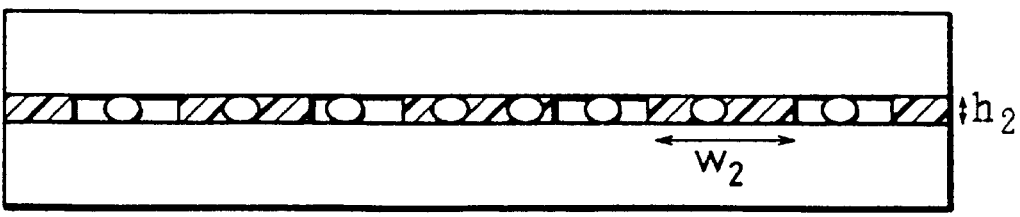
FIG. 16(d) is an explanatory drawing showing an example of the process for bonding the substrates in the case when the gap keeping members are used in accordance with the eighth embodiment of the present invention.

And then, as shown in FIG. 16(c), the other substrate is arranged so as to oppose the substrate on which the connecting members are patterned, and as shown in FIG. 16(d), the pair of substrates are bonded to each other. At this time, the substrates are pressed with a predetermined pressing force, the gap keeping members 35 are pushed into the connecting members, and the height of the connecting members, that is, an interval between the substrates is reduced to the height of the gap keeping members 35, "h2". Further, the width of the connecting member expands to "w2" due to the pressing force.

With the arrangement of the above-mentioned manufacturing method, upon bonding the substrates, the gap keeping members 35 disposed between the substrates make it possible to prevent the interval between the substrates from decreasing to less than the predetermined value, "h2" and to prevent the width of the connecting member from increasing to more than the predetermined value, "w2". Therefore, even in the case when the large substrates are bonded to each other, the interval between the substrates can be kept by the gap keeping members 35 so that it is possible to achieve the even shapes of the connecting members after the bonding operation, that is, the even heights "h2" and the even widths "w2" within the surface. Specifically, just after the patterning operation has been completed, in the case when "h1", which is the height of the connecting member, is set at approximately 10 μm, the width "w1" is set at approximately 80 μm, and the gap keeping member 35 with a diameter of 9 μm is adopted, it is possible to achieve the "h2" of approximately 9 μm as the height of the connecting member and the width "w2" of approximately 90~100 μm when the bonding operation is completed. As a result, it becomes possible to obtain the even connecting resistance value for each connecting member within the surface. Furthermore, even in the case when the substrate is not flat and the distribution of pressure is not even upon bonding the substrates, the gap keeping members 35 support the substrates so as to maintain the shape of the connecting members; thus, it becomes possible to prevent the neighboring connecting members from coming into contact with each other.

Figure 17:
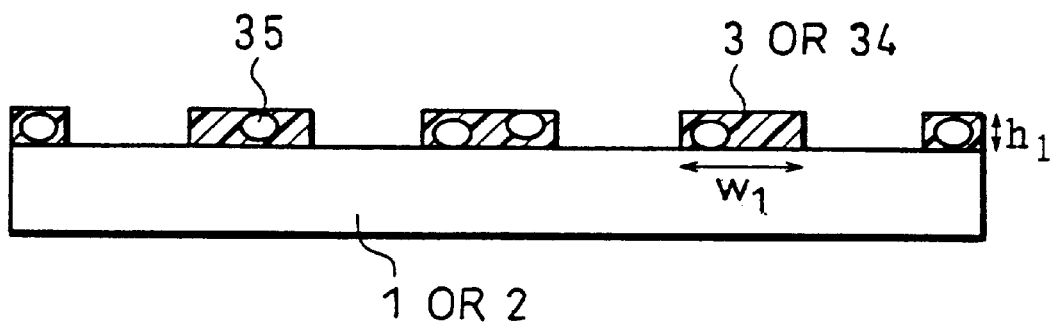
FIG. 17(a) is an explanatory drawing showing another example of the process for bonding the substrates in the case when the gap keeping members are used in accordance with the eighth embodiment of the present invention.
FIG. 17(b) is an explanatory drawing showing another example of the process for bonding the substrates in the case when the gap keeping members are used in accordance with the eighth embodiment of the present invention.
FIG. 17(c) is an explanatory drawing showing another example of the process for bonding the substrates in the case when the gap keeping members are used in accordance with the eighth embodiment of the present invention.
Figure 17:
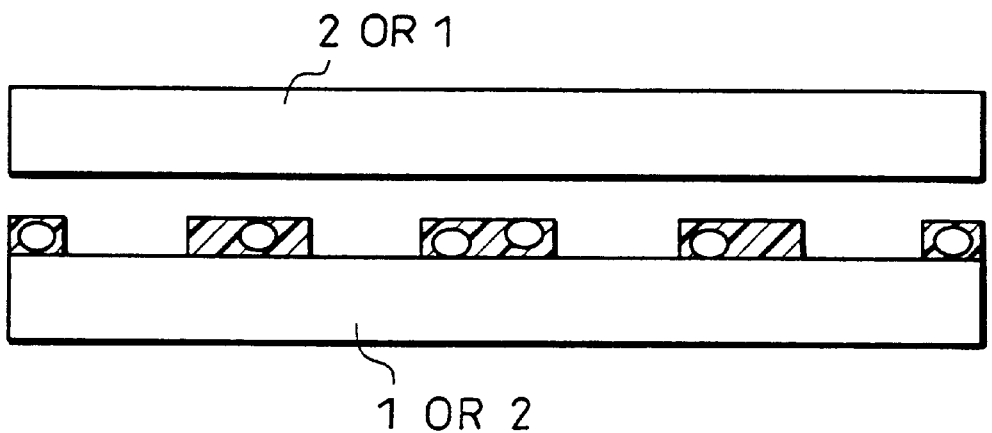
Figure 17:
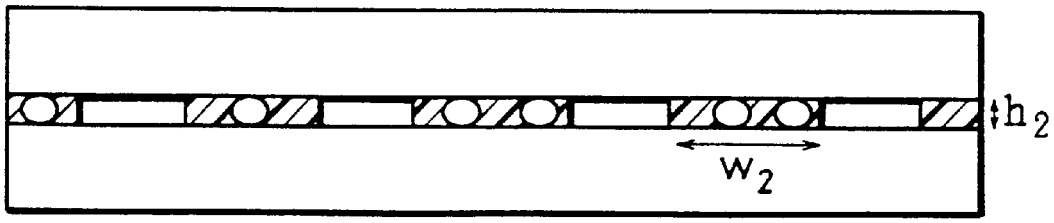

Moreover, FIGS. 17(a) through 17(c) describe another example of the manufacturing method of the two-dimensional image detecting device in accordance with the present embodiment.

Firstly, as shown in FIG. 17(a), on at least one of the active-matrix substrate 1 and the opposing substrate 2, the connecting members(photosensitive resin 3 or the conductive bonding agent 34) are patterned in accordance with the pattern formation of the pixel electrodes by using any one of the methods described in Embodiments 1 through 7 in a state in which the gap keeping members 35 are dispersively contained in advance within the connecting members. At this time, it is assumed that the connecting member is formed so as to have a thickness of "h1" and a width of "w1". Furthermore, the gap keeping members 35 exist merely in the patterned connecting members. It is possible to adopt a sphere and a textile(fiber) made of glass, quartz, and plastics which are superior insulators, as the gap keeping member 35.

And then, as shown in FIG. 17(b), the other substrate is arranged so as to oppose the substrate on which the connecting members are patterned, and as shown in FIG. 17(c), the pair of substrates are bonded to each other. At this time, the substrates are pressed with a predetermined pressing force, the height of the connecting members, that is, an interval between the substrates is reduced to the height of the gap keeping members 35, "h2". Further, the width of the connecting member expands to "w2" due to the effect of the pressing force.

As compared with the manufacturing method described in FIGS. 16(a) through 16(d), the above-mentioned method makes it possible to provide the gap keeping members 35 without adding another step merely by dispersing the gap keeping members in advance within the photosensitive resin 3 or the conductive bonding agent 34 which serve as connecting members.

[EMBODIMENT 9]

With regard to the two-dimensional image detecting device described in Embodiments 1 through 8, it is possible to improve the reliability by devising the position of connecting members(conductive photosensitive resin 3 or conductive bonding agent 34) for bonding an active-matrix substrate 1 and an opposing substrate 2.

Figure 18:
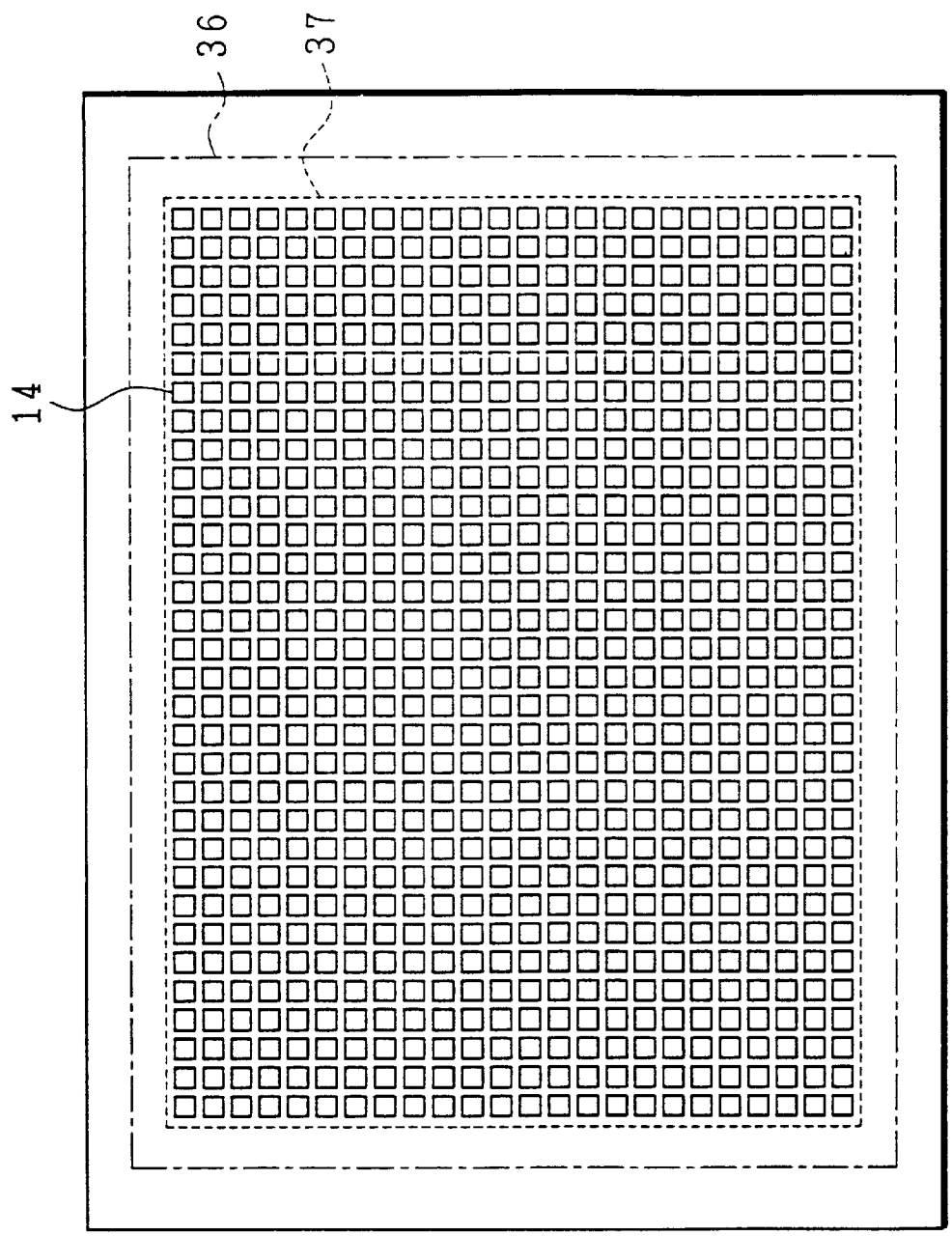
FIG. 18 is a top view showing an outline of the active-matrix substrate in accordance with the ninth embodiment of the present invention.

FIG. 18 is a top view showing a model of the active-matrix substrate 1 for illustrating a positional relationship among the appearance of the active-matrix substrate 1, a positioning area 36 and an image receiving are 37 of the opposing substrate 2. Here, the image receiving area 37 is an area in which pixel electrodes 14 which are necessary for detecting image are arranged in a matrix form. Additionally, FIG. 18 and FIG. 19, which is described later, illustrate the smaller number of pixels(larger pixel size) for convenience; however, the actual arrangement has a higher density of pixels. For example, the two-dimensional image detecting device for medical radiography has a pixel density of 100~300 $\mu$m pitch for the size of 40 cm×50 cm.

FIGS. 1 through 7 describe an example in which in accordance with each of the pixel electrodes 14, each of the connecting members such as the photosensitive resin 3 and the conductive bonding agent 34 is patterned by using a photolithography technology or a printing technology, and then the active-matrix substrate 1 and the opposing substrate 2 are bonded to each other in a state in which the pixel electrodes 14 of the active-matrix substrate 1 and the connecting electrodes 6 of the opposing substrate 2 oppose each other. At this time, even if the connecting members are patterned merely on the pixel electrodes 14 in the image receiving area 37, the two-dimensional image detecting device of the present invention can perform its operations.

Additionally, the two-dimensional image detecting device of the present embodiment is characterized in that the connecting members are patterned on not only on the image receiving area 37 but also on a surrounding area 38(area between the positioning area 36 of the opposing substrate 2 and the image receiving area 37) so as to improve the reliability.

Figure 19:
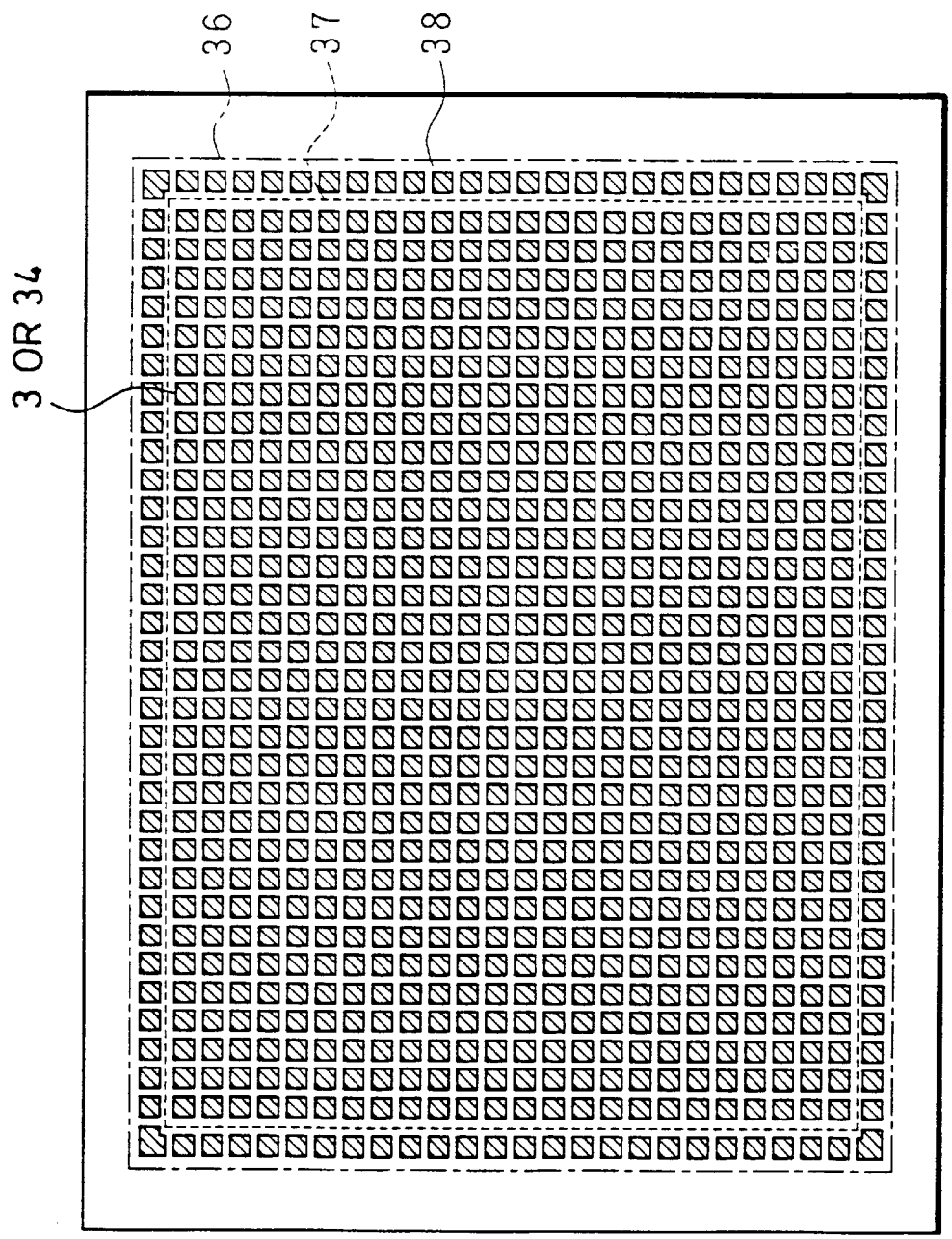
FIG. 19 is a top view showing a positional relationship of the active-matrix substrate and the connecting members formed on the substrate in accordance with the ninth embodiment of the present invention.

FIG. 19 is a top view showing a positional relationship of the active-matrix substrate 1 illustrated in FIG. 18 and the connecting members patterned on the pixel electrodes (indicated by hatched portions in FIG. 19). As shown in FIG. 19, in the present embodiment, the two-dimensional image detecting device has a construction in which the connecting members are arranged on the surrounding area 38 as well as on the image receiving area 37, namely, the area in which pixel electrodes 14 for detecting image are arranged in a lattice form.

The connecting members disposed on the surrounding area 38 do not need to electrically connect the active-matrix substrate 1 and the opposing substrate 2. The connecting members are disposed merely for physically connecting the substrates, namely, these connecting members are dummy connecting members for reinforcement.

Normally, in the case when the active-matrix substrate 1 and the opposing substrate 2 are physically bonded to each other with the connecting members patterned on the pixel electrodes 14, the connecting members formed on the outermost part of the image receiving area 37 are subject to stress and effects of the surrounding environment, and consequently tend to be exfoliated. However, with the above-mentioned arrangement, the dummy connecting members are patterned on the surrounding area 38 as well as on the image receiving area 37 so that the connecting members receive less stress and fewer effects of the surrounding environment; therefore, the reliability can be improved. Additionally, even if some of the dummy connecting members formed on the surrounding area 38 are exfoliated due to stress and influence of the surrounding environment, the image receiving ability is not affected as long as the connecting members formed on the image receiving area 37 are not exfoliated.

Further, the pattern formation of the dummy connecting members disposed on the surrounding area 38 is not particularly limited to that of FIG. 19. Any pattern formation of the dummy connecting members is acceptable as long as the dummy connecting members are disposed on the surrounding area 38 and on the bonding area between the active-matrix substrate 1 and the opposing substrate 2.

Moreover, in the above-mentioned Embodiments 7 through 9, it is possible to use the active-matrix substrate 25 instead of the active-matrix substrate 1, and the opposing substrate 22 or 30 instead of the opposing substrate 2.

As described above, the two-dimensional image detecting device of the present invention has a construction in which after an active-matrix substrate 1 and an opposing substrate 2 have been separately formed, the substrates are bonded to each other, the opposing substrate includes a semiconductive layer having photoconductivity; therefore, in addition to the aforementioned effects, this arrangement makes it possible to generally improve the yield as compared with a case in which the semiconductive layer(photoconductive film) is directly formed on the active-matrix substrate 1. Namely, with the conventional construction in which the photoconductive film is directly stacked on the active-matrix substrate, in the event of a defective photoconductive film, the active-matrix substrate thereunder is spoiled as well. In contrast, in the case of the present invention, it is possible to choose a non-defective active-matrix substrate and opposing substrate so as to make a pair of the substrates; therefore, the yield can be improved.

Furthermore, the present invention is not particularly limited to the aforementioned semiconductive materials and sensor construction; thus, the present invention is applicable to the two-dimensional image detecting device using other semiconductive materials and sensor constructions. For example, the aforementioned explanation describes an example of the construction in which polycrystals such as CdTe and CdZnTe having superior X-ray sensitivity are used as the semiconductive layer(photoconductive film). In addition, other semiconductive materials such as a-Se and a-Si are also acceptable as the photoconductive film. Moreover, the opposing substrate 2 is also allowed to have the construction in which a converting layer(for example, CsI) for converting an X-ray into visible light and a visible light sensor are combined with each other.

Furthermore, Embodiments 1 through 9 describe the two-dimensional image detecting device mainly for dealing with an X-ray(radiation); however, in the case when the semiconductor to be used(semiconductive substrate 16 or semiconductive film 32) has photoconductivity to visible light and infrared light as well as to radiations such as an X-ray, the two-dimensional detecting device is applicable for dealing with visible light and/or infrared light. However, in this case, it is necessary to use a transparent electrode made of ITO for transmitting visible light and/or infrared ray ,as an upper electrode 17 which is disposed on the entry side of light when viewed from the semiconductor. Additionally, it is desirable to optimize the thickness of the semiconductor in accordance with absorption efficiency of visible light and/or infrared ray.

Furthermore, in Embodiments 1 through 9, a TFT 5 is adopted as a switching element used in the active-matrix substrate 1(or an active-matrix substrate 25), and in addition, it is possible to use a two-terminal element such as an MIM(Metal-Insulator-Metal) and a varistor, and the switching element composed of the combination of diodes such as a diode ring and a back-to-back diode.

As described above, the two-dimensional image detecting device of the present invention allows the semiconductive layer to have sensitivity to radiations; consequently, it is possible to realize the two-dimensional image detecting device for radiations.

Moreover, the two-dimensional image detecting device allows the semiconductive layer to be constituted by a compound semiconductor made of a material selected from CdTe and CdZnTe. Therefore, such a semiconductive material has higher sensitivity(S/N ratio) to radiation such as an X-ray as compared with a material made of a-Se which has been conventionally used, thereby improving the response of the two-dimensional image detecting device.

Furthermore, in this case, voltage applied to the electrode section can be set lower than that of prior art; therefore; it is possible to omit a dielectric layer for providing a protection against high voltage appearing between the semiconductive layer and the electrode section.

Additionally, the construction in which the dielectric layer is provided between the semiconductive layer and the electrode section requires a step(sequence) for removing electrical charge remained in the dielectric layer for each frame. Therefore, the conventional two-terminal detecting image device has been capable of merely detecting a static image; however, with this arrangement, the present invention makes it possible to detect a moving image by omitting the dielectric layer.

The two-dimensional image detecting device allows a photosensitive resin to be used as the connecting member. This arrangement makes it possible to precisely pattern the connecting member by using the photolithography technology.

The two-dimensional image detecting device allows a liquid-type resin to be used as the photosensitive resin. This arrangement makes it easy to apply the photosensitive resin to a large substrate as well by using the spinning method, etc.

The two-dimensional image detecting device allows a film-type resin to be used as the photosensitive resin. With this arrangement, the photosensitive resin is a film-type resin which is superior in having an even thickness so that it is possible to easily achieve an even interval between the substrates upon bonding large substrates.

The two-dimensional image detecting device allows a negative-photosensitive resin to be used as the photosensitive resin and allows transparent electrodes to be used as the pixel electrode. With this arrangement, upon patterning the photosensitive resin, exposure is given from the other side of the surface on which the photosensitive resin is formed so that it is possible to perform a self-alignment exposure with electrode wires serving as a mask. Therefore, it is not necessary to prepare a photo mask for exposing the photosensitive resin, and furthermore, this arrangement causes no shift of the pattern formation of the photosensitive resin.

The two-dimensional image detecting device is also allowed to have a plurality of connecting electrodes formed on the surface of the semiconductive layer of the opposing substrate in a manner so as to oppose a plurality of the pixel electrodes formed on the active-matrix substrate.

With this arrangement, a plurality of the connecting electrodes allow the semiconductive pixels formed on the opposing substrate to oppose a plurality of the pixel electrodes formed on the active-matrix substrate so that the semiconductive pixels are electrically separated from one another. Therefore, electrical charge, which appears in the semiconductor due to incidence of radiation and/or ray of light, is collected merely in the connecting electrode corresponding to the incident position without entering into the surrounding pixels; consequently, it is possible to restrain electrical cross talk.

The two-dimensional image detecting device is also allowed to have a construction in which at least one of the connecting electrode and the pixel electrode has an area larger than the connecting area of the patterned connecting member.

With this arrangement, the connecting member is formed on the electrode having a larger area so that even in the event of shift upon bonding the active-matrix substrate and the opposing substrate, electrical cross talk can be restrained between adjacent pixels.

The two-dimensional image detecting device is also allowed to have a plurality of connecting electrodes formed on the surface of the semiconductive layer of the opposing substrate so as to oppose each of the pixel electrodes formed on the active-matrix substrate.

With this arrangement, a plurality of the connecting electrodes opposing one pixel electrode can be positioned at any place in accordance with the bonding position of the active-matrix substrate and the opposing substrate; thus, a sensitive positioning is not necessary upon bonding the substrates.

The two-dimensional image detecting device is also allowed to arrange so that each connecting electrode has a width smaller than a distance between adjacent pixel electrodes. With this arrangement, even in the event of shift upon bonding the active-matrix substrate and the opposing substrate, electrical cross talk can be restrained between adjacent pixels.

The two-dimensional image detecting device is also allowed to have the connecting members patterned not only on an image receiving area of the active-matrix substrate that have the pixel electrodes formed thereon but also on a surrounding area which has no pixel.

With this arrangement, dummy connecting members are patterned on the surrounding area of the image-receiving area as well; thus, the connecting members on the image receiving area receive less stress and influence of the surrounding environment so that the reliability can be improved. Additionally, even if some of the dummy connecting members formed on the surrounding area are exfoliated due to stress and influence of the surrounding environment, the image receiving ability is not affected as long as the connecting members formed on the image receiving area are not exfoliated.

The two-dimensional image detecting device is also allowed to have gap keeping members provided between the active-matrix substrate and the opposing substrate.

Conventionally, without the gap keeping members, in the case when the substrates are inclined or the pressure distribution is not even upon bonding, values of the gaps between the substrates tend to be uneven within the surface. And then, on the portions where the gaps are smaller than a predetermined value, the connecting members are squashed flat by pressure which is more than demanded so that the neighboring connecting members come into contact with each other. However, with the above-mentioned arrangement, in the case of when the substrates are inclined or the pressure distribution is not even upon bonding, the gap keeping members support the substrates so as to maintain the shapes of the connecting members; thus, it is possible to achieve more even shapes of the connecting members within the surface of the substrate. Therefore, it becomes possible to make an even connecting resistance value for each of the connecting members within the surface. Furthermore, this arrangement prevents the neighboring connecting members from coming into contact with each other.

The two-dimensional image detecting device is also allowed to have the gap keeping members mixed in the connecting members in advance. Specifically, in the case when the photosensitive resin is used as the connecting member, it is desirable to disperse the gap keeping members in the photosensitive resin with a predetermined density. Furthermore, in the case when conductive bonding agent is used as the connecting members, it is desirable to disperse the gap keeping members in a paste of the bonding agent with a predetermined density.

With this arrangement, since the gap keeping members are mixed in the connecting members in advance, it is possible to omit the step in which the gap keeping members are placed later. Thus, the process can be simplified.

The two-dimensional image detecting device is also allowed to have a construction in which the semiconductive layer having photoconductivity serves as a supporting substrate in the opposing substrate. With this arrangement, as the semiconductive layer, it is possible to adopt a crystal semiconductive substrate which is obtained by using a Bridgman method, a gradient freeze method, a travel heating method, and so on.

The two-dimensional image detecting device is also allowed to have a construction in which the opposing substrate has a substrate which transmits light and radiation to be detected as a supporting substrate, and the semiconductive layer having photoconductivity is formed on the supporting substrate. With this arrangement, the opposing substrate can increase its own strength.

Further, as described above, the manufacturing method of the two-dimensional image detecting device is also allowed to include a step in which, as the connecting member, a liquid-type photosensitive resin is applied on at least one of the active-matrix substrate and the opposing substrate, and then the photosensitive resin is patterned by using the photolithograpy technology.

With this method, the liquid-type photosensitive resin is adopted as the connecting members so that it is possible to easily apply the photosensitive resin to a large substrate by using a method such as the spinning method. Furthermore, the photolithography technology makes it possible to precisely perform a patterning operation.

The manufacturing method of the two-dimensional image detecting device is also allowed to pattern the photosensitive resin by using the photolithography technology after a film-type photosensitive resin has been transferred on at least one of the active-matrix substrate and the opposing substrate as the connecting member.

With this method, the film-type photosensitive resin which is superior in having an even thickness is used as the connecting member so that it is easy to achieve an even interval between the substrates upon bonding the large substrate. Furthermore, the photolithography technology makes it possible to precisely perform a patterning operation.

With the manufacturing method of the two-dimensional image detecting device is also allowed to include a step in which the photosensitive resin serving as the connecting member is applied on a temporary supporting body and is patterned into a predetermined shape by using the photolithography technology. And the photosensitive resin is bonded to at least one of the active-matrix substrate and the opposing substrate, only the temporary supporting body is exfoliated, and then the photosensitive resin is transferred to the electrodes of the substrate.

With this method, the photosensitive resin is transferred to the active-matrix substrate or the opposing substrate after having been patterned on the temporary supporting body, and a state in which the photosensitive resin is patterned on the temporary supporting body is inspected so that only non-defective products are used; therefore, this method can improve the yield as compared with the method in which the photosensitive resin is patterned on the active-matrix substrate and the opposing substrate.

With the manufacturing method of the two-dimensional image detecting device is also allowed to include a step in which the photosensitive resin serving as connecting members is applied or transferred to the active-matrix substrate, the pixel electrodes composed of transparent electrodes having been formed on the active-matrix substrate, and the photosensitive resin is patterned by a self-alignment exposure with electrode wires arranged in a matrix form serving as a mask.

This method allows the photosensitive resin to be patterned by the self-alignment exposure with electrode wires serving as a mask so that it is not necessary to prepare the photomask for exposing the photosensitive resin, and furthermore, this method causes no shift of the pattern of the photosensitive resin.

The manufacturing method of the two-dimensional image detecting device is also allowed to include a step in which the conductive bonding agent serving as the connecting members is patterned on at least one of the active-matrix substrate and the opposing substrate by using the printing method. With this method, it is possible to pattern the connecting members(conductive bonding agent) by using an inexpensive printing device.

The manufacturing method of the two-dimensional image detecting device is also allowed to include a step in which the connecting members are patterned on at least one of the active-matrix substrate and the opposing substrate, and furthermore, the gap keeping members are placed on at least one of the substrates.

With this method, even in the case when the substrate is inclined or the pressure distribution is not even upon bonding, the gap keeping members support the substrates so as to maintain the shapes of the connecting members; therefore, it is possible to achieve more even shapes of the connecting members within the surface of the substrate. Further, it is possible to easily disperse and place the gap keeping members on the substrate having the connecting members patterned thereon, by using a wet spraying method or a dry spraying method.

The manufacturing method of the two-dimensional image detecting device is also allowed to pattern the connecting members having contained the gap keeping members in advance, on at least one of the active-matrix substrate and the opposing substrate.

With this method, it is possible to provide the gap keeping members without adding another step merely by dispersing the gap keeping members in advance into the photosensitive resin and the conductive bonding agent which serve as connecting members. Further, even in the case when the substrates are inclined or the distribution of pressure is not even upon bonding the substrates, the gap keeping members support the substrates so as to maintain the shapes of the connecting members; therefore, it is possible to achieve more even shapes of the connecting members within the surfaces the substrates.

With the manufacturing method of the two-dimensional image detecting device is also allowed to include a step in which, upon bonding the active-matrix substrate and the opposing substrate, the substrates are subjected to a heating operation while being pressed by using an evacuated pressing method so as to be bonded to each other.

With this method, the active-matrix substrate and the opposing substrate are subjected to a heating operation while being pressed by using the evacuated pressing method so that even pressure can be obtained upon bonding large substrates.

With the manufacturing method of the two-dimensional image detecting device is also allowed to include a step in which, upon bonding the active-matrix substrate and the opposing substrate, the substrates are pressed by using a pressure pressing method while being subjected to a heating operation so as to be bonded to each other.

With this method, the active-matrix substrate and the opposing substrate are pressed by using the pressure pressing method while being subjected to a heating operation so that even in the case when it is necessary to apply pressure which is more than air pressure($1\ kgf/cm^2$), it is possible to deal with the substrates.

With the manufacturing method of the two-dimensional image detecting device is also allowed to include a step in which, upon bonding the active-matrix substrate and the opposing substrate, the substrates pass through the heating rollers so as to be bonded to each other.

With this method, even upon bonding large substrates, it is not necessary to apply the pressing force on the entire surface of the substrate so that a relatively small-size pressing device can be used instead of a large hydraulic pressing device, etc. Therefore, it is possible to simplify the bonding process and the device used for the process.

With the manufacturing method of the two-dimensional image detecting device is also allowed to include a step in which, upon bonding the active-matrix substrate and the opposing substrate, the substrates are bonded to each other by using an autoclave device.

With this method, even in the case when it is necessary to apply pressure which is more than air pressure ($1\ kgf/cm^2$), it is possible to deal with the substrates and an even pressure is achieved upon bonding large substrates.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-dimensional image detecting device, which has:
   a pixel alignment layer including electrode wires arranged in a lattice form, a plurality of switching elements, each being disposed at each lattice point, and electrical charge storage capacities, each including a pixel electrode which is connected with said electrode wires via said switching element;
   an electrode section formed in a manner so as to oppose virtually the entire surface of said pixel alignment layer; and
   a semiconductive layer formed between said pixel alignment layer and said electrode section, said semiconductive layer having photoconductivity, comprising:
   an active-matrix substrate including said pixel alignment layer, and
   an opposing substrate including said electrode section and said semiconductive layer,
   wherein both substrates are disposed in such a state in which said pixel alignment layer of said active-matrix substrate and said semiconductive layer of said opposing substrate oppose each other, and both substrates are connected with each other via connecting members which are patterned in accordance with said pixel electrodes and which have conductivity and bonding property.

2. The two-dimensional image detecting device as defined in claim 1, wherein said semiconductive layer has sensitivity to radiation.

3. The two-dimensional image detecting device as defined in claim 2, wherein said semiconductive layer is a compound semiconductor made of a material selected from the group consisting of CdTe and CdZnTe.

4. The two-dimensional image detecting device as defined in claim 1, wherein said connecting member is made of photosensitive resin.

5. The two-dimensional image detecting device as defined in claim 4, wherein said photosensitive resin is a liquid-type resin.

6. The two-dimensional image detecting device as defined in claim 4, wherein said photosensitive resin is a film-type resin.

7. The two-dimensional image detecting device as defined in claim 4, wherein said photosensitive resin is a negative-photosensitive resin and said pixel electrode is a transparent electrode.

8. The two-dimensional image detecting device as defined in claim 1, wherein a plurality of connecting electrodes are formed on the surface of the semiconductive layer of said opposing substrate so as to oppose a plurality of pixel electrodes formed on said active-matrix substrate.

9. The two-dimensional image detecting device as defined in claim 8, wherein at least one of said connecting electrode and said pixel electrode has an area larger than a connecting area of said patterned connecting member.

10. The two-dimensional image detecting device as defined in claim 1, wherein a plurality of connecting electrodes are formed on the surface of the semiconductive layer of said opposing substrate so as to oppose each of the pixel electrodes formed on said active-matrix substrate.

11. The two-dimensional image detecting device as defined in claim 10, wherein said connecting electrode has a width smaller than a distance between adjacent pixel electrodes.

12. The two-dimensional image detecting device as defined in claim 1, wherein on said active-matrix substrate, said connecting members are patterned not only on an image receiving area which has pixel electrodes but also on a surrounding area thereof which has no pixel electrode.

13. The two-dimensional image detecting device as defined in claim 1, wherein gap keeping members are disposed between said active-matrix substrate and said opposing substrate.

14. The two-dimensional image detecting device as defined in claim 13, wherein said gap keeping members are mixed in said connecting member in advance.

15. The two-dimensional image detecting device as defined in claim 1, wherein said opposing substrate is provided with the semiconductive layer having photoconductivity which serves as a supporting substrate.

16. The two-dimensional image detecting device as defined in claim 1, wherein said opposing substrate is provided with a substrate which transmits light and/or radiation to be detected as a supporting substrate, and the semiconductive layer which has photoconductivity is formed on the supporting substrate.

17. A manufacturing method of a two-dimensional image detecting device, said two-dimensional image detecting device comprising: a pixel alignment layer having electrode wires arranged in a lattice form, a plurality of switching elements, each being disposed at each lattice point, and electrical charge storage capacities, each having a pixel electrode which is connected with the electrode wire via the switching element;

an electrode section formed in a manner so as to oppose virtually the entire surface of said pixel alignment layer; and a semiconductive layer formed between said pixel alignment layer and said electrode section with photoconductivity, said method comprising the steps of:
(1) forming an active-matrix substrate including said pixel alignment layer;
(2) forming an opposing substrate including said electrode section and the semiconductive layer;
(3) forming connecting members which are patterned in accordance with said pixel electrodes on at least one of said active-matrix substrate and said opposing substrate and which have conductivity and bonding property; and
(4) connecting both substrates via said patterned connecting members in a state in which said pixel alignment layer of said active-matrix substrate and said semiconductive layer of said opposing substrate oppose each other.

18. The manufacturing method of the two-dimensional image detecting device as defined in claim 17, wherein in said step(3), a liquid-type photosensitive resin is applied to at least one of said active-matrix substrate and said opposing substrate so as to serve as said connecting members, and then said photosensitive resin is patterned by using a photolithography technology.

19. The manufacturing method of the two-dimensional image detecting device as defined in claim 17, wherein in said step(3), a film-type photosensitive resin is transferred to at least one of said active-matrix substrate and said opposing substrate so as to serve as said connecting members, and then said photosensitive resin is patterned by using a photolithography technology.

20. The manufacturing method of the two-dimensional image detecting device as defined in claim 17, wherein in the step(3), said photosensitive resin serving as the connecting member is applied on a temporary supporting body and is patterned into a predetermined shape by using the photolithography technology; afterwards, said photosensitive resin is bonded to at least one of the active-matrix substrate and the opposing substrate, and only said temporary supporting body is exfoliated so that said photosensitive resin is transferred to the electrodes of the substrate.

21. The manufacturing method of the two-dimensional image detecting device as defined in claim 17, wherein in the step(3), said photosensitive resin serving as connecting members is applied or transferred to said active-matrix substrate, said pixel electrodes composed of transparent electrodes having been formed on said active-matrix substrate, and said photosensitive resin is patterned by a self-alignment exposure with electrode wires arranged in a matrix form serving as a mask.

22. The manufacturing method of the two-dimensional image detecting device as defined in claim 17, wherein in said step(3), a conductive bonding agent serving as said connecting members is patterned on at least one of said active-matrix substrate and said opposing substrate by using a printing method.

23. The manufacturing method of the two-dimensional image detecting device as defined in claim 17, wherein said step(3) further includes a step in which after the connecting members have been patterned on at least one of said substrates, gap keeping members are placed on at least one of said active-matrix substrate and said opposing substrate.

24. The manufacturing method of the two-dimensional image detecting device as defined in claim 17, wherein in said step(3), said connecting members which have contained said gap keeping members in advance are patterned on at least one of said active-matrix substrate and said opposing substrate.

25. The manufacturing method of the two-dimensional image detecting device as defined in claim 17, wherein in said step(4), upon bonding said active-matrix substrate and said opposing substrate, the substrates are pressed by using an evacuated pressing method while being subjected to a heating operation so as to be bonded to each other.

26. The manufacturing method of the two-dimensional image detecting device as defined in claim 17, wherein in said step(4), upon bonding said active-matrix substrate and said opposing substrate, the substrates are pressed by using a pressure pressing method while being subjected to a heating operation so as to be bonded to each other.

27. The manufacturing method of the two-dimensional image detecting device as defined in claim 17, wherein in said step(4), upon bonding said active-matrix substrate and said opposing substrate, the substrates pass through heating rollers so as to be bonded to each other.

28. The manufacturing method of the two-dimensional image detecting device as defined in claim 17, wherein in said step(4), upon bonding said active-matrix substrate and said opposing substrate, the substrates are bonded to each other by using an autoclave device.

* * * * *